US010734539B2

(12) United States Patent
Lin et al.

(10) Patent No.: US 10,734,539 B2
(45) Date of Patent: Aug. 4, 2020

(54) PHOTODETECTOR

(71) Applicant: National Taiwan University, Taipei (TW)

(72) Inventors: Ching-Fuh Lin, Taipei (TW); Hung-Chieh Chuang, Taipei (TW); Meng-Jie Lin, Taipei (TW); Po-Jui Huang, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 16/294,225

(22) Filed: Mar. 6, 2019

(65) Prior Publication Data

US 2019/0348564 A1    Nov. 14, 2019

(30) Foreign Application Priority Data

May 14, 2018    (TW) .............................. 107116340 A

(51) Int. Cl.
*H01L 31/102*    (2006.01)
*H01L 21/00*    (2006.01)
*H01L 31/108*    (2006.01)
*H01L 31/0224*    (2006.01)

(52) U.S. Cl.
CPC .. *H01L 31/1085* (2013.01); *H01L 31/022408* (2013.01)

(58) Field of Classification Search
CPC .............................................. H01L 31/022408
USPC .............. 438/57–60, 474, 514; 257/458, 449
See application file for complete search history.

(56) References Cited

U.S. PATENT DOCUMENTS

| 9,331,189 | B2* | 5/2016 | Kim | .................... H01L 29/7613 |
| 9,368,667 | B1* | 6/2016 | Kim | .................. H01L 31/02327 |
| | | | | 257/290 |
| 10,054,563 | B2* | 8/2018 | Ram | ..................... C12Q 1/001 |
| 10,446,700 | B2* | 10/2019 | Wang | .................... H01L 31/028 |
| 2015/0228837 | A1 | 8/2015 | Chen et al. | |
| 2018/0217138 | A1* | 8/2018 | Han | ........................ H01L 31/09 |
| 2019/0058073 | A1 | 2/2019 | Fujiwara et al. | |

FOREIGN PATENT DOCUMENTS

| DE | 4242035 A1 | 6/1994 |
| KR | 20110131588 A | 12/2011 |

OTHER PUBLICATIONS

Preliminary Search Report dated Apr. 1, 2020 in related French Application No. FR1909355.
Boris Desiatov et al., "Slicon Pyramids for Plasmonic Enhanced Schottky Photodetectors," Optical Society of America, 2013.
(Continued)

*Primary Examiner* — Calvin Lee
(74) *Attorney, Agent, or Firm* — Donald E. Stout; Stout, Uxa & Buyan, LLP

(57) ABSTRACT

A photodetector is provided with a metal-semiconductor junction for measuring infrared radiation. In another embodiment, the photodetector includes structures to achieve localized surface plasmon resonance at the metal-semiconductor junction stimulated by incident light. The photodetector hence has prompted response and broadband spectra region for photon detection. The photodetector can be used for detecting varied powers of incident light with wavelength from visible to mid-infrared region (300 nm~20 µm).

20 Claims, 18 Drawing Sheets

(56) References Cited

OTHER PUBLICATIONS

Boris Desiatov et al., "Plasmonic Enhanced Near IR Scottky Detectors Based on Internal Photoemission in Nano Pyramids," Optical Society of America, 2014.
Mohd Faizol Abdullah et al., "Improved Coverage of rGO Film on Si Inverted Pyramidal Microstructures for Enhancing the Photovoltaic of rGO/Si Heterojunction Solar Cell," Materials Science in Semiconductor Processing, 96, 2019, pp. 137-144.
X.M. Dai et al., "High Efficiency N-Silicon Solar Cells Using Rear Junction Structures," IEEE, 1993. pp. 153-156.
Office Action dated Feb. 6, 2020 in corresponding United Kingdom Patent Application No. GB1911691.2.

* cited by examiner

PHOTODETECTOR

CROSS-REFERENCE TO RELATED APPLICATIONS

The entire contents of Taiwan Patent Application No. 107116340, filed on May 14, 2018, from which this application claims priority, are expressly incorporated herein by reference.

BACKGROUND OF THE INVENTION

1. Field of the Invention

The present invention relates to a photodetector with prompted response and broadband spectra region which are beneficial for photon detection.

2. Description of Related Art

In 1938, W. H. Schottky proposed that the metal-semiconductor junction can generate a potential barrier after thermal equilibrium, namely, Schottky barrier or Schottky junction. FIG. 1A shows that a p-type semiconductor is used as an example in which the main carrier is a hole (h+), and each metal and semiconductor has its own energy band, Fermi level, and energy gap before being contacted. Let the work function ($q\phi_m$) of metal be smaller than the work function ($q\phi_s$) of semiconductor. The work function is defined as the energy difference between the Fermi level and the vacuum level $E_{vac}$. The electron affinity $q\chi$ of the semiconductor is the energy difference between conduction band $E_c$ and semiconductor vacuum level $E_{vac}$.

As shown in FIG. 1B, after the metal is in contact with the semiconductor, the Fermi level of the semiconductor is lower than the Fermi level of the metal. After thermal equilibrium, the hole in the p-type semiconductor flows into the metal, leaving the negative charge in the semiconductor. A space charge is formed on both sides of the metal-semiconductor junction, and a built-in electric field $V_{bi}$ is generated. If the main carrier hole (h+) in the p-type semiconductor is needed to flow to the metal from the semiconductor, the built-in electric field $V_{bi}$ at the junction must be overcome. If a bias is applied so that the carrier can overcome the built-in electric field, the applied bias is called the turn on voltage. If the hole needs to go to the semiconductor from the metal, the Schottky barrier at the junction must be overcome. This kind of bending energy band or energy barrier that stops the carrier from moving is called the Schottky junction.

According to the metal-semiconductor junction theory, a p-type semiconductor needs to match with a metal with a large work function, and an n-type semiconductor needs to match with a metal with a small work function, so that a Schottky junction can be formed. And the Schottky barrier height can be estimated by IV-curve or CV-curve.

In 1959, H Y Fan and A K Ramdas et al. found that after a semiconductor is irradiated with light, electrons or holes originally in the semiconductor valence band are excited by incident photons and then jump to the conduction band to form an electron-hole pair or hot carriers, and this mechanism is called mid band-gap absorption (MBA). To make the incident light excite an electron-hole pair, the energy of the incident photon needs to be larger than the energy gap of semiconductor, so that the carrier can obtain sufficient energy to surpass the energy gap of semiconductor and form a photocurrent. At present, photodetectors widely utilize this semi conductor mid band-gap ab sorption mechanism.

Current infrared sensors mostly use semiconductors with small energy gaps such as III-V or Ge as the active layer or detection-absorbing material to detect infrared light with a small photon energy. Although existing III-V or Ge detectors have been well-established in their manufacturing process, these materials are more expensive than other materials, and the process requires many complex and expensive epitaxial devices. The detection principle of such devices is mostly mid band-gap absorption (MBA). Carriers in the semiconductor are excited by incident light and surpass the semiconductor bandgap to generate photocurrents. Therefore, in order to improve the detection efficiency or the responsivity of the device, such components often need to incorporate complex multiple quantum wells (MQWs) or multiple quantum dots (MQDs) in the active layer.

SUMMARY OF THE INVENTION

In one general aspect, the present invention relates to a photodetector, and more particularly to a broadband photodetector.

According to a first embodiment of this invention, a photodetector is provided with a semiconductor, an ohmic contact electrode, and a metal electrode. The ohmic contact electrode forms an ohmic contact with a first surface of the semiconductor. The metal electrode forms a Schottky contact with a second surface of the semiconductor. Wherein carriers in the metal electrode are excited by an incident light to form electron hole pairs or hot carriers to cross a Schottky barrier between a junction of the metal electrode and the semiconductor and thus form a photocurrent.

In one embodiment, the micro-nanostructure comprises a nanostructure array.

In one embodiment, the absorption spectrum of the photodetector has an absorption ratio more than 40% in the wavelength range between 300 nm and 2700 nm.

In one embodiment, the semiconductor comprises silicon (nature, p-type, or n-type).

In one embodiment, the semiconductor is a planar semiconductor substrate.

In one embodiment, photons with energy smaller than the band gap of semiconductor can be detected.

According to a second embodiment of this invention, a photodetector is provided with a semiconductor, an ohmic contact electrode, and a metal electrode, wherein the semiconductor comprises a micro-nanostructure. The ohmic contact electrode forms an ohmic contact with a first surface of the semiconductor. The metal electrode forms a Schottky contact with the surface of the micro-nanostructure. Carriers in the metal electrode are excited by an incident light to form electron hole pairs or hot carriers to cross a Schottky barrier between a junction of the metal electrode and the semiconductor and thus form a photocurrent. Wherein, the incident light induces localized surface plasmon resonance (LSPR) on the surface of the micro-nanostructure, and when the plasmon decay wave generated by LSPR is transmitted to the Schottky junction, the strong near field will excite a large number of hot carriers to promote response of the photodetector. This micro-nanostructure contains periodic structures to induce LSPR, increase the light absorption, and optimize the response of the photodetector.

In one embodiment, photons with energy smaller than the Schottky barrier and photons with energy smaller than the band gap of semiconductor both can be detected.

In one embodiment, the micro-nanostructure is a nanostructure array, and each nanostructure of the nanostructure array comprises multiple linear lengths.

In one embodiment, the micro-nanostructure is an inverted pyramidal array nanostructure (IPAN).

In one embodiment, the incident light with a wavelength range of 500 nm to 4000 nm can induce localized surface plasmon resonance in the inverted pyramidal array nanostructure.

In one embodiment, the localized surface plasmon resonance is polarization-insensitive. Conventional surface plasmon resonance structures can only induce the surface plasmon resonance by incident light in a specific polarization direction, and therefore the localized surface plasmon resonance is polarization-sensitive. The three-dimensional inverted pyramidal array nanostructure proposed here satisfies the two-dimensional geometrical symmetry for unit and two-dimensional symmetry for periodical array, and hence both X-polarized and the Y-polarized incident infrared light can generate an LSPR.

In one embodiment, the incident light enters from a second surface of the semiconductor to improve the metal electrode with the disadvantage of easy oxidation, and the second surface is opposite to the first surface.

In one embodiment, the absorption spectrum of the photodetector has an absorption ratio more than 80% in the wavelength range between 450 nm and 2700 nm.

In one embodiment, the photodetector operates at a bias voltage of 0 mV and has an average photocurrent response higher than 300 nA.

DETAILED DESCRIPTION OF THE PREFERRED EMBODIMENT

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations and components are not been described in detail in order not to unnecessarily obscure the present invention. While drawings are illustrated in details, it is appreciated that the quantity of the disclosed components may be greater or less than that disclosed, except expressly restricting the amount of the components. Wherever possible, the same or similar reference numbers are used in drawings and the description to refer to the same or like parts.

A first embodiment of the present invention proposes a photodetector with a metal-semiconductor junction. The photodetector can detect light with energy less than the energy gap of the semiconductor, and can produce photocurrent under an only condition that the energy of the incident light is slightly larger than the Schottky barrier.

Figure 1A:
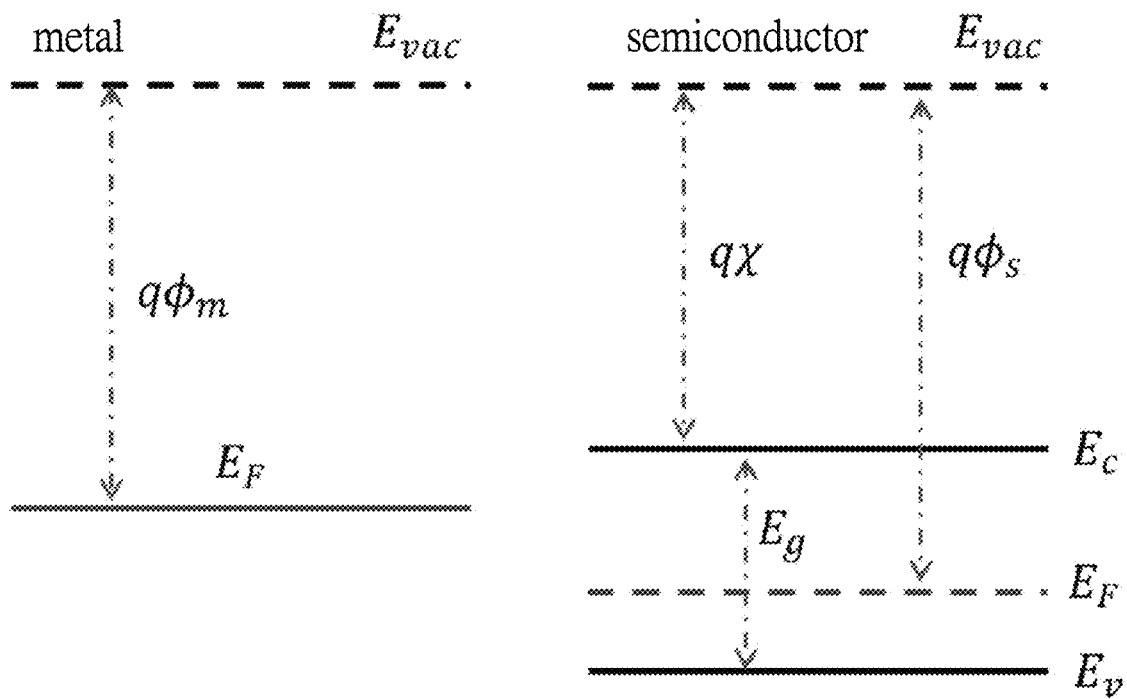
FIG. 1A shows the energy band before the metal is in contact with the semiconductor.
Figure 1B:
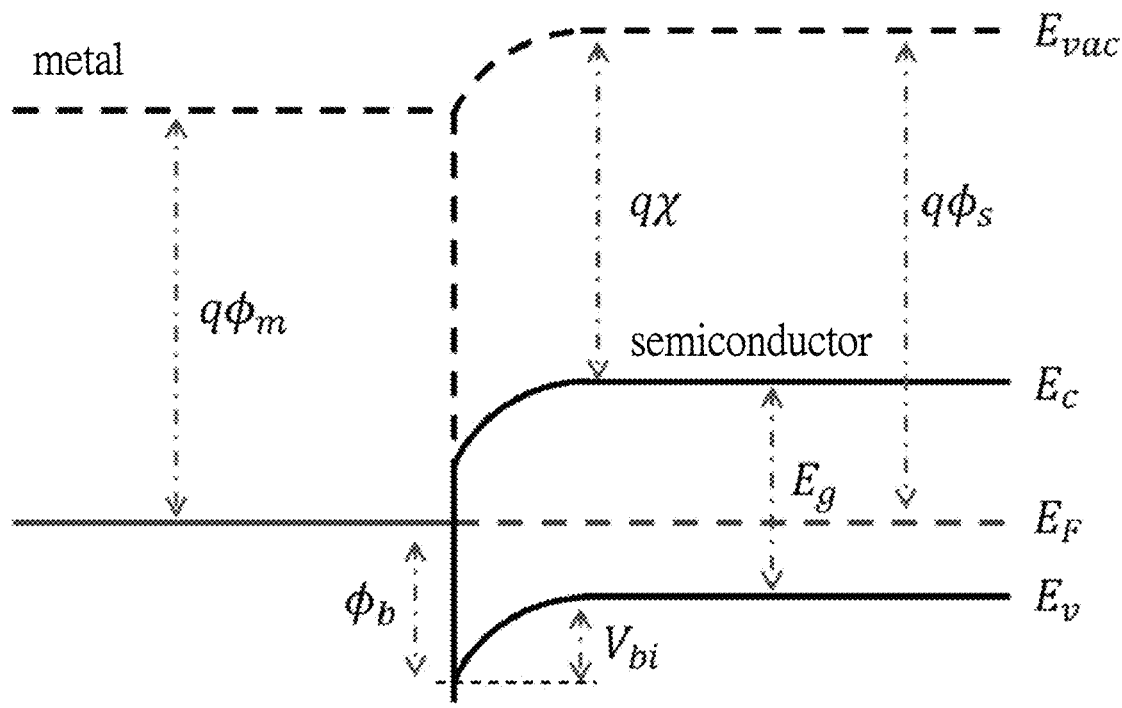
FIG. 1B shows the energy band after the metal is in contact with the semiconductor.
Figure 2:
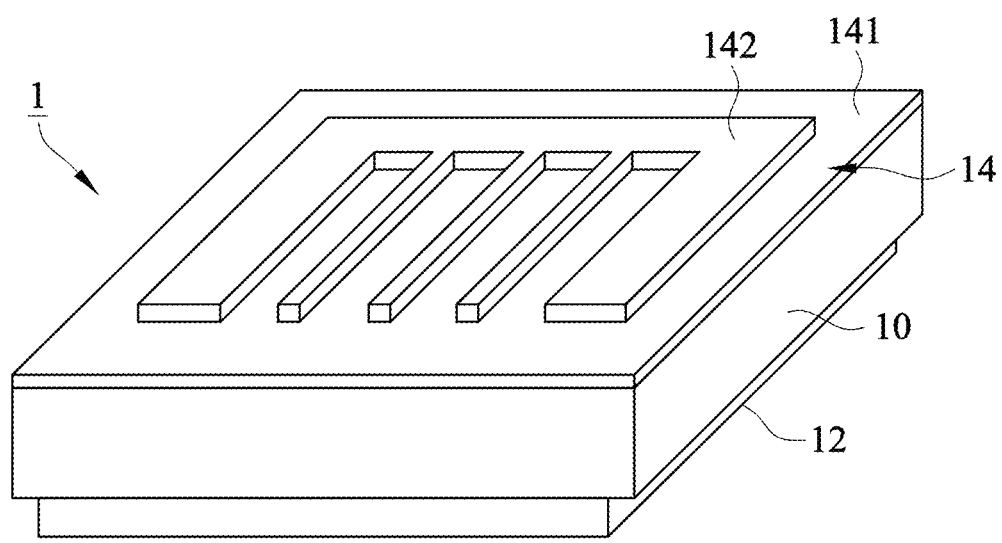
FIG. 2 shows a photodetector according to a first embodiment of the present invention.

FIG. 2 shows a photodetector 1 according to an embodiment of the present invention. As shown in FIG. 2, the photodetector 1 includes a semiconductor 10, an ohmic contact electrode 12, and a metal electrode 14. The metal electrode 14 may include a Schottky contact electrode 141 and a grid electrode 142. In this embodiment, the semiconductor 10 is p-type silicon, the ohmic contact electrode 12 is made of platinum, and the metal electrode 14 is made of chromium. In some embodiments, the ohmic contact electrode 12 may be gold or silver, and the metal electrode 14 may be copper.

In the present embodiment, the semiconductor 10 is a p-type (100) double-sided polished silicon wafer having a resistivity of 5-10 Ω-cm and a thickness of 380-420 μm. First, the silicon wafer is cut into a 2.5×2.5 cm$^2$ silicon substrate 10 using a diamond pen. Then, the silicon substrate is immersed in acetone, isopropyl alcohol (IPA), deionized water (DI-water), and methanol in sequence, and washed by an ultrasonic cleaner for 15 minutes to remove surface organisms and particles.

Next, a piranha solution is prepared with a volume ratio of sulfuric acid ($H_2SO_4$) to hydrogen peroxide ($H_2O_2$) of 4:1. First, the sulfuric acid is poured into a glass dish, and then the hydrogen peroxide is slowly poured into the glass dish and the solution is heated to 120° C. After the gas generated during the mixing is volatilized, the silicon substrate 10 is immersed into the solution for 10 minutes. In this step, a thin oxide film is grown on the surface of the silicon substrate 10 to isolate surface contaminations from the substrate. Next, silicon dioxide on the surface of the silicon substrate 10 is removed with a buffered oxide etching (BOE) solution. Finally, the silicon substrate 10 is rinsed with deionized water (DI-water) and dried with nitrogen to complete the cleaning procedure.

After cleaning, the silicon substrate 10 is placed into an electron beam evaporation system (ULVAC), and a metal electrode 14 is deposited under a pressure of $4 \times 10^{-6}$ torr. First, a chromium nano-film with thickness of 10-20 nm is deposited on the top surface of the silicon substrate 10 as a Schottky contact electrode 141, where the depositing rate is 0.1 angstrom (Å) per second. A metal shadow mask is then applied on the chromium nano-film so as to deposit a Cr metal grid 142 with a thickness of 120 nm on the chromium nano-film under a deposition rate of 0.1 angstroms (Å)-10 nm per second, 0.3 angstroms (Å)-30 nm per second, and 0.5 angstroms (Å)-50 nm per second, and 1 angstrom (Å)-100 nm per second. Finally, a platinum film with a thickness of 100 nm is deposited on the bottom of the p-type silicon substrate as the ohmic contact electrode 12, and the deposition rate is the same as that of the chromium grid electrode. After that, the photodetector 1 is completed, as shown in FIG. 2. Next, the produced photodetector 1 is subjected to IV-curve of photocurrent and dark current. Labview measurement software is used with a Keithley 2400 source meter to measure in a dark box using a 1550 nm, 2 mW infrared laser (model Thorlab:LDC1300B) as the light source.

Figure 3:
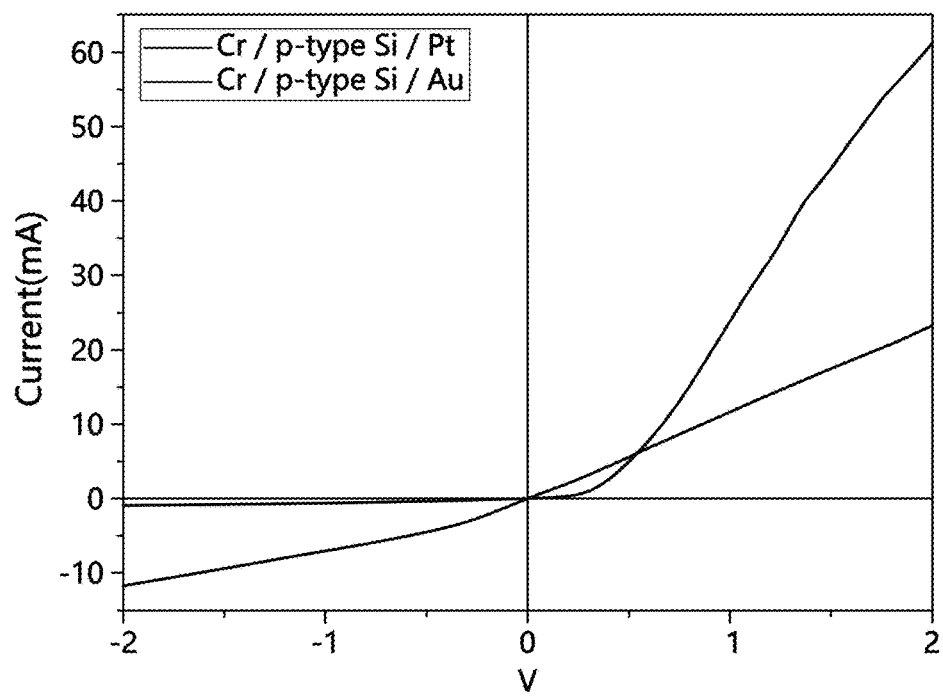
FIG. 3 shows IV measurements of the photodetector using gold and platinum as ohmic contact electrodes.

In another embodiment of the present invention, the ohmic contact electrode 14 is made of gold (using platinum that forms an ohmic contact with the P-type silicon, the photodetector will have a better forward bias), and the remaining elements are made of the same materials as in the previous embodiment. FIG. 3 shows IV measurements of the photodetector using gold and platinum as ohmic contact electrodes 14, respectively. As shown in FIG. 3, the photodetector using platinum as the ohmic contact electrode 12 has better rectification performance. It generates a large current when it is forward biased, and has a small leakage current when it is reverse biased. The turn on voltage of which is around only 0.3 V, which reveals the standard Schottky diode characteristics.

As shown in FIG. 2, the metal electrode 14 may include a Schottky contact electrode 141 made of chromium with thickness of 10-20 nm and a grid electrode 142 made of chromium with thickness of 120 nm. In another embodiment, photodetector having Schottky contact electrodes 141 made of 10 nm and 20 nm of chromium were separately fabricated and their performances were compared. Three dark currents and three photocurrents were measured for each component. The measurement results show that the thinner 10 nm Schottky contact electrode 141 advantages the incident light to enter the active region of the photodetector and thereby enhances the response of the photodetector.

Figure 4:
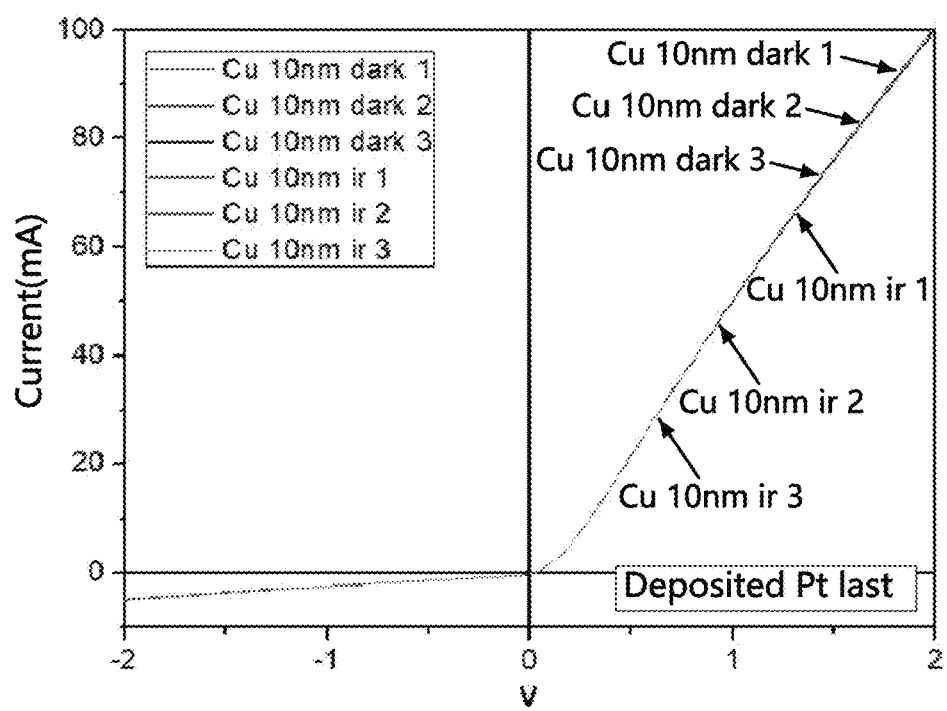
FIG. 4 shows the dark current and photocurrent of a photodetector made of evaporated copper followed by deposition of platinum.

In another embodiment of the invention, the semiconductor 10, the ohmic contact electrode 12, and the metal electrode 14 are made of p-type silicon, platinum, and copper, respectively. The photodetector is fabricated with the described same procedure, and the metal electrode 14 includes a 10 nm copper Schottky contact electrode 141 and a 120 nm chromium grid electrode 142. In addition, in order to avoid the influence of the high temperature on the copper nano-film during the deposition of platinum, the deposition sequence was changed to deposit copper first followed by deposition of platinum. The dark current and photocurrent of this photodetector are shown in FIG. 4. The performance of the copper/p-type silicon photodetector is closer to that of the standard Schottky diode, while the produced photodetector has more excellent rectifying characteristics and also a small turn on voltage. The photodetector generates large current when it is operated in the forward biased region, and maintains a smaller reverse bias when it is operated in a reverse biased region. Accordingly, it is found that the problem of leakage current operated in reverse biased region can be solved by changing the deposition sequence.

In the embodiment of the present invention, a Schottky barrier is formed at the gold-semiconductor junction so that the carriers flow on in only one specific direction to form a rectification. The p-type silicon wafer used in this invention was theoretically calculated to have Fermi level $E_F=-4.952$ eV, and chromium (−4.5 eV) or copper (−4.65 eV) was selected as the metal electrode. The Schottky barrier formed by the chrome/p-type silicon is approximately 0.67 eV, and its measured cut-off wavelength is approximately 1850 nm within near-infrared region. The Schottky barrier formed by copper/p-type silicon is approximately 0.52 eV, and its cut-off wavelength is approximately 2384 nm.

Figure 5:
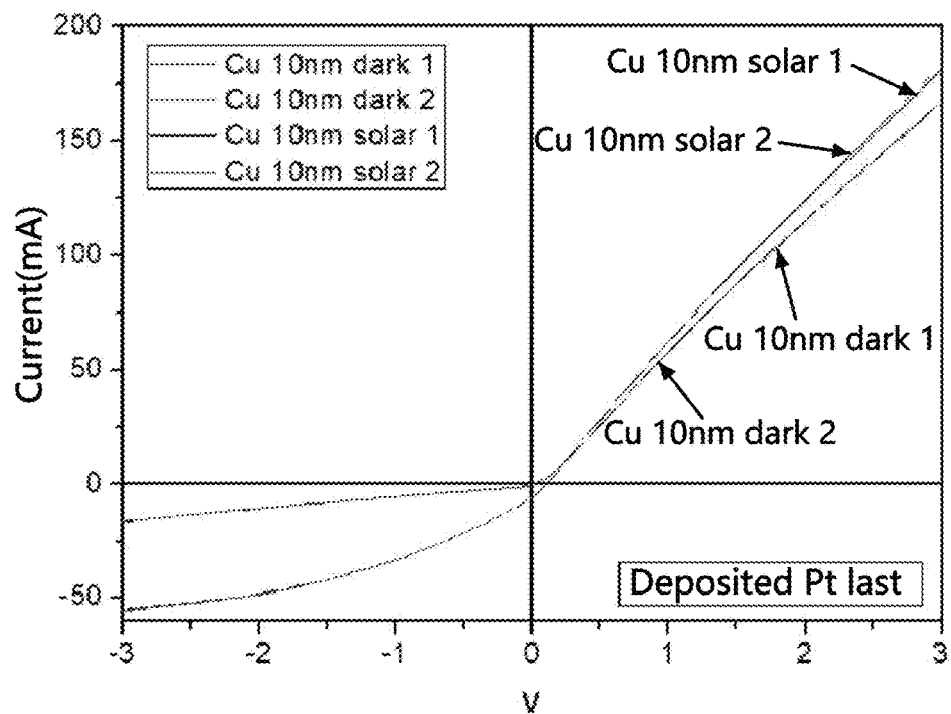
FIG. 5 shows the photocurrent response of a copper/p-type silicon component that is under a visible light irradiation and measured by a solar simulator.

FIG. 5 shows the photocurrent of the copper/p-type silicon photodetector measured under visible light illumination from a solar simulator (Atom solar simulator, Sun 2000). The dark current of the copper/p-type silicon photodetector exhibits the same rectification characteristics as the standard Schottky diode. When irradiated with sunlight, there is a significant current difference between the photocurrent and the dark current in the forward or reverse bias regions. In particular, in the reversed bias region, the photodetector 1 generates approximately 40 mA photocurrent after illumination.

Figure 6:
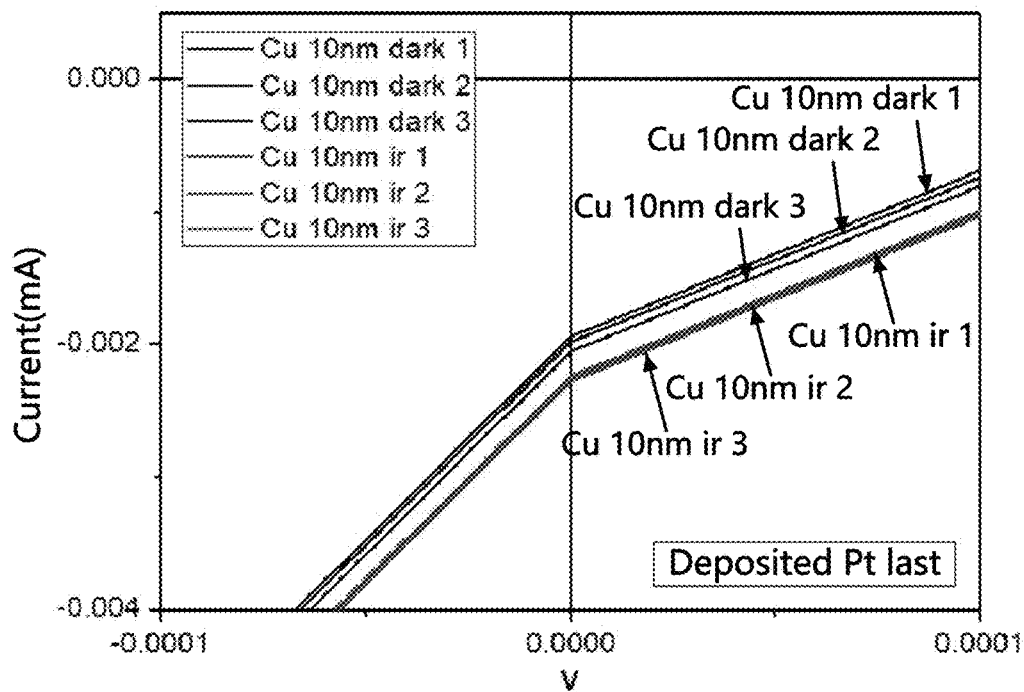
FIG. 6 shows the photocurrent response of the photodetector operating at 0 bias.

FIG. 6 shows that the copper/p-type silicon photodetector also has a recognizable photocurrent response when the photodetector operates at 0 bias. Although the response is not as large as in the −2, −1, 1 or 2 V region, the response of the copper/p-type silicon photodetector shows excellent stability, and the variation of dark current of the photodetector operating at 0 V is only 0.1 μA (113 nA), where the response is about 270 nA. This response and variation of the photodetector is more stable compared with operating at other voltages.

Figure 7:
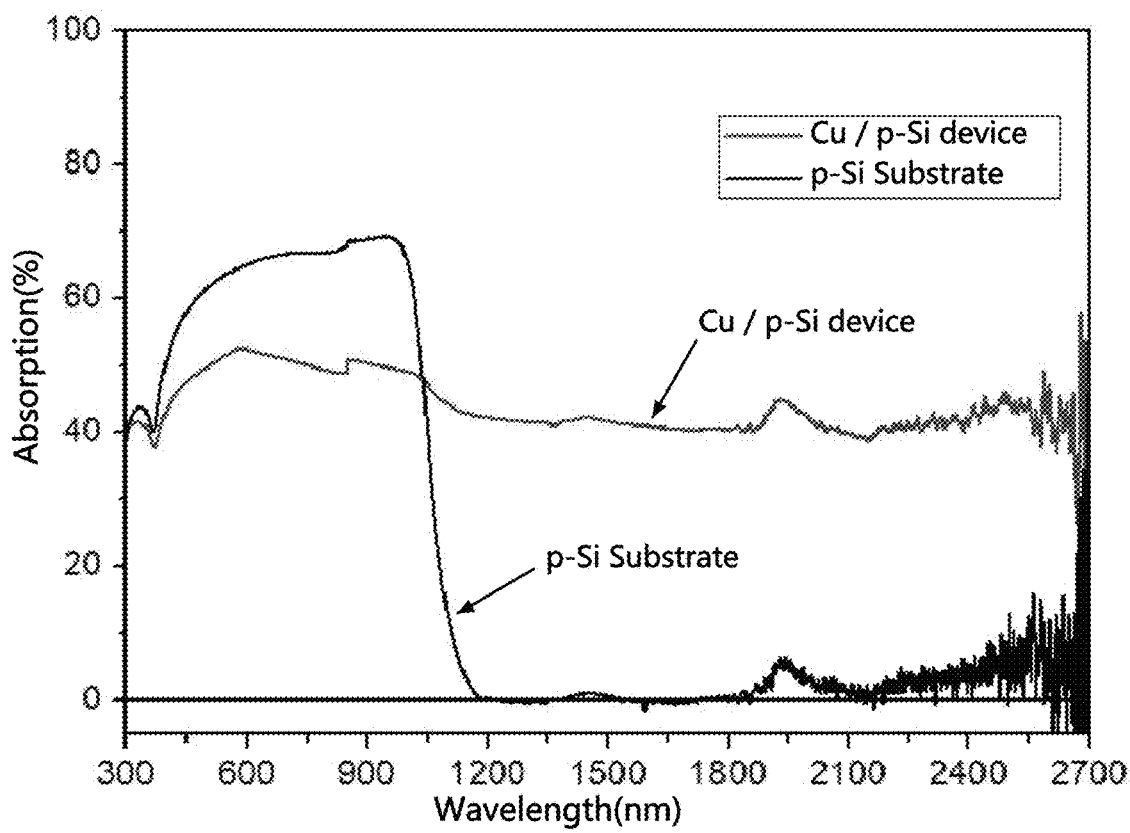
FIG. 7 shows the absorption spectra of a copper/p-type silicon photodetector according to a first embodiment of the present invention.

FIG. 7 shows the absorption spectrum comparison between the copper/p-type silicon photodetector and a silicon substrate. As shown in FIG. 7, the absorption spectrum of the silicon substrate is in good agreement with the theory. Most of the incident light with wavelength less than 1107 nm can be absorbed by the silicon substrate. In the vicinity of 1107 nm, the absorption of the silicon substrate rapidly decreased, and the light with wavelength greater than 1107 nm are hardly absorbed. This result is in good agreement with the theoretical value of the silicon substrate absorption. The energy gap of silicon is 1.12 eV, which has a theoretical absorption wavelength of about 1107 nm. The incident light with energy greater than 1.12 eV will be absorbed by the silicon substrate, so the silicon substrate has a good absorption in the range of 1107 nm to visible light. Photons with energy less than the energy gap of silicon are no longer absorbed by the silicon substrate, so the absorption of silicon substrate is close to zero for the lights with wavelength greater than 1107 nm. The absorption spectrum of the copper/p-type silicon photodetector exhibits broad-band absorption, and has absorption of about 40% for the incident light range from 300 to 2700 nm. In the visible light region, copper causes reflection of incident light, so the absorption of the copper/p-type silicon photodetector in the visible region is lower than that of the silicon substrate. Absorption in the 1000 to 2300 nm range is mainly due to the Schottky barrier absorption. The incident photons on the metal side excite the hot carrier to cross the Schottky barrier of the photodetector and form a thermal current, causing absorption of photons with wavelength between 1000 and 2300 nm by the Schottky barrier. The absorption of incident photon with wavelength greater than 2300 nm is due to semicontinue. Because the metal film is a copper film with thickness of 10 nm, it does not form a flat homogeneous film on the silicon substrate, but forms a lot of tiny particles thereon. Accordingly, incident light with different wavelengths will resonate with a partially matched resonance region on the surface of the metal film and localized surface plasmon resonance (LSPR) is achieved.

Figure 8:
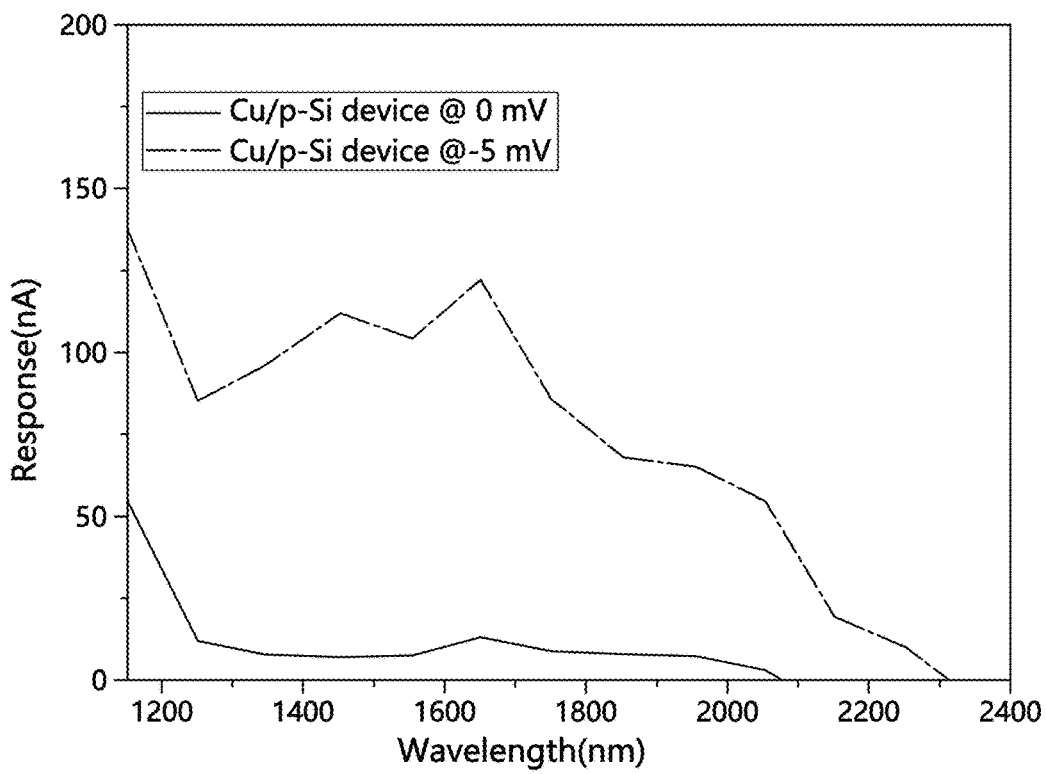
FIG. 8 shows response of the copper/p-type silicon photodetector of the first embodiment of the present invention for incident light at different wavelengths.

FIG. 8 shows the copper/p-type silicon photodetector used to measure the response of incident light with different wavelengths. As shown in FIG. 8, this result is in good agreement with the Fowler equation, and the copper/p-type silicon photodetector can also improve its response by applying a slight bias of −5 mV. The measured results show that the response of the copper/p-type silicon photodetector will gradually decrease as the incident light wavelength increases whether it is operated in 0 mV or −5 mV. In addition, it is clearly observed from the curve of −5 mV that the cutoff wavelength of this copper/p-type silicon photodetector is about 2310 nm. Using this cutoff wavelength, the Schottky barrier, about 0.53 eV, can be calculated from the formula $E\ (eV)=hc/\lambda=1240/(\lambda\ (nm))$. As discussed before, the Schottky barrier of this copper/p-type silicon photodetector is approximately 0.52 eV based on theoretical calculations. The Schottky barrier based on the measured results of this copper/p-type silicon photodetector is very close to the theoretical value (0.52 eV), which proves that the copper/p-type silicon photodetector can indeed measure photons with energy below the energy gap of silicon. However, such planar copper/p-type photodetector can generate photocurrents in the infrared region by only internal photoemission absorption (IPA), lacking other assistant optimization mechanisms. For used as general Schottky photodetectors, it is not easy to achieve high-efficiency response.

Internal photoemission absorption (IPA) refers to carriers in a metal that are excited by incident photons and forms electron-hole pairs or hot carriers to cross the Schottky barrier, thereby forming photocurrent via the external circuit by the physical mechanism. In order to absorb incident photon-excited hot carriers by the Schottky barrier, the energy of incident light need only be slightly larger than the Schottky barrier, so that the hot carriers excited by the incident light get enough energy to cross the Schottky barrier.

Figure 9A:
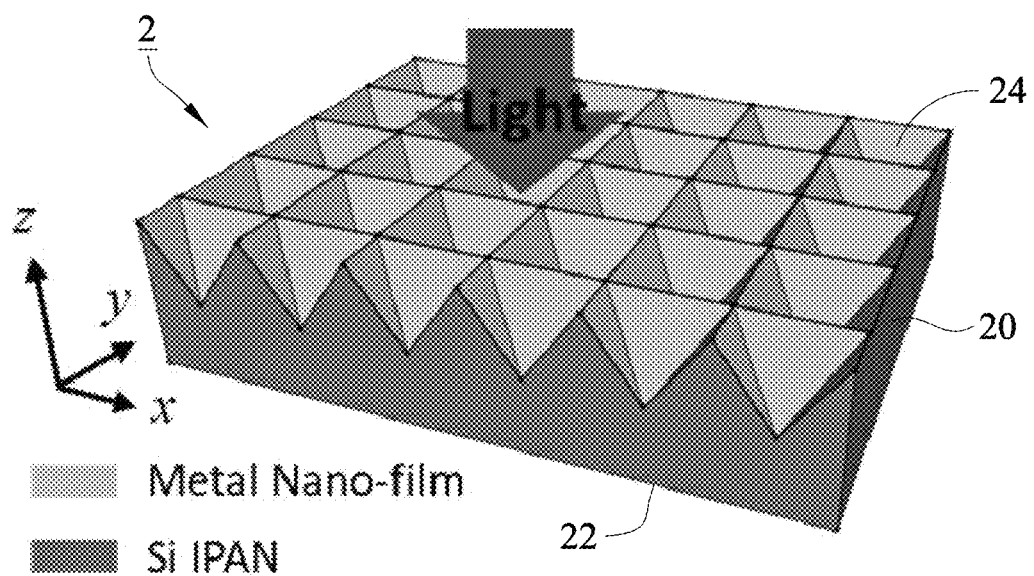
FIG. 9A is a perspective view showing a photodetector according to a second embodiment of the present invention.

FIG. 9A shows a photodetector in accord with a second embodiment of the present invention. As shown in FIG. 9A, the photodetector 2 includes a semiconductor 20, an ohmic contact electrode 22, and a metal electrode 24 (including a Schottky contact electrode). The photodetector 2 differs from the photodetector 1 of the first embodiment in that the semiconductor 20 is not planar and features a periodic microarray nanostructure.

Figure 10:
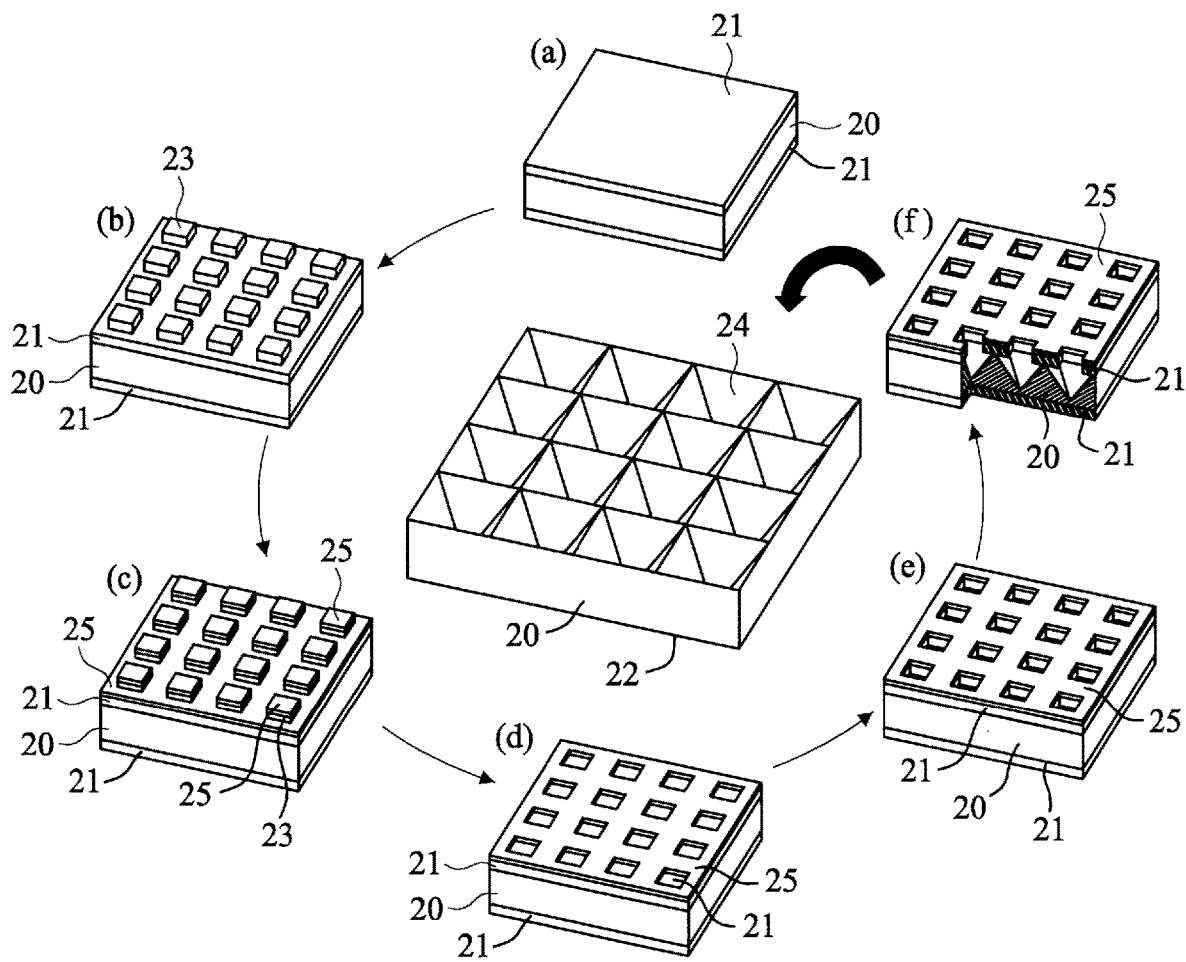
FIG. 10 shows a method of manufacturing the photodetector according to the second embodiment of the present invention.

As shown in FIG. 9A, in this embodiment, the periodic microarray nanostructure is a 3D inverted pyramid array nanostructure (IPAN). FIG. 10 shows a method of manufacturing the photodetector 2. In this embodiment, the semiconductor is a p-type double-sided polished silicon (100) wafer, which has a resistivity of 5-10 Ω-cm and a thickness of 380-420 μm. First, the silicon wafer is cut with a diamond pen into a 2.5×2.5 $cm^2$ silicon substrate 20. Next, the silicon substrate 20 is cleaned with acetone, isopropyl alcohol (IPA), deionized water (DI-water), and methanol sequentially, and finally an ultrasonic cleaner is used to wash the surface of the silicon substrate for 15 minutes to remove organic substances and fine particles on the surface. Next, the silicon substrate was sequentially washed with a piranha solution, a hydrofluoric acid solution, and deionized water as described above, and the silicon substrate 20 was blown dry with a nitrogen spray gun.

Figure 9B:
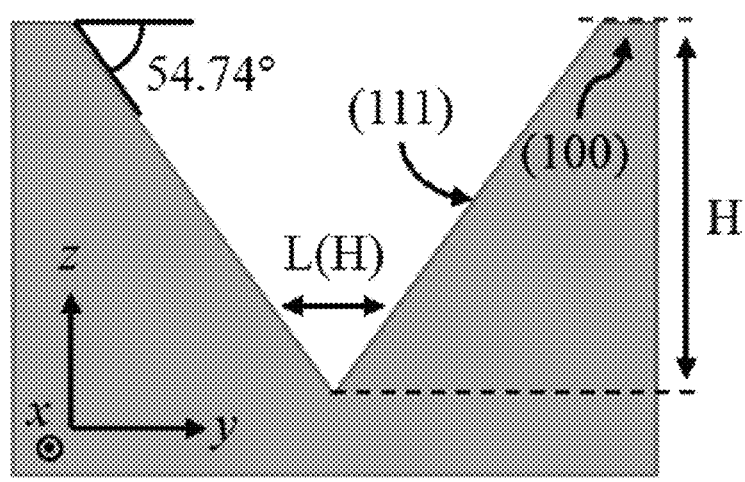
FIG. 9B is a cross-sectional view showing one of a periodic microarray nanostructure of the photodetector according to the second embodiment of the present invention.

FIG. 9B is a cross-sectional view showing a three-dimensional inverted pyramid array nanostructure (IPAN) according to an embodiment of the present invention. As shown in FIG. 9B, H is the height of the inverted pyramid cavity and L(H) is the length of the inverted pyramid cavity wall. As the height H increases, the cavity wall length L(H) also increases. Although the inverted pyramid array nanostructure has a fixed period, each pyramid has variable or multiple cavity wall lengths L (H).

FIG. 10 shows a method to produce the inverted pyramid array nanostructure (IPAN) of FIGS. 9A and 9B. As shown in step (a), after cleaning the silicon substrate 20, a silicon dioxide film 21 with thickness of 500 nm is deposited on the top and bottom surfaces of the silicon substrate 20 by a plasma enhanced chemical vapor deposition apparatus. The silicon dioxide film 21 on the top surface serves as an etching mask for anisotropic etching by potassium hydroxide, and the silicon dioxide film 21 on the bottom surface serves as a protective layer during etching. The flow rates of the reaction gases are listed as follows: $SiH_4$: 40 sccm; $N_2O$: 160 sccm. In addition, the deposition temperature, pressure, and time are 350° C., 67 Pa, and 10 minutes, respectively.

As shown in step (b) of FIG. 10, a lithography process is used to define the surface pattern of the silicon substrate 20. First, a photoresist (S1813) 23 of a photolithography process is uniformly coated to the silicon dioxide film 21 on the top surface of the silicon substrate 20 using a spin coater. The coating parameters are 1000 rpm, 10 seconds/4000 rpm, and 40 seconds. The coated photoresist 23 is then soft-baked at 115° C. for 3 minutes. Acetone can be used to clean the mask to be exposed. Then, the silicon substrate 20 is placed in the exposure machine, and the edge of the silicon substrate 20 is aligned with the edge of mask, and the mask is exposed for 20 seconds. Then, the silicon substrate 20 is rotated 90° after exposure once and then is aligned the edge of mask and closely attached the mask for secondary exposure for 20 seconds. Next, the exposed silicon substrate 20 is immersed in the S1813-dedicated developer MF-319 for 13 seconds. Then, the developed silicon substrate 20 is immersed in deionized water to remove the residual photoresist 23 and the developer, and dried with a nitrogen spray gun. Finally, the silicon substrate 20 is hard-baked with a hot plate at 125° C. for 1 minute.

As shown in step (c) of FIG. 10, the silicon substrate 20 is placed into a thermal evaporation coater (ULVAC) and a chromium film 25 with a thickness 40 nm is deposited on the top surface of the silicon substrate 20 with a deposition rate of 0.3 angstroms (Å) per second in a vacuum environment lower than $4 \times 10^{-6}$ torr.

As shown in step (d) of FIG. 10, the silicon substrate 20 is then immersed in acetone and washed for 30 to 90 minutes by an ultrasonic cleaner to remove the photoresist 23 and the chromium 25 above the photoresist 23, and the remaining chromium 25 will be used as a mask for subsequent dry etching process.

As shown in step (e) of FIG. 10, the etching is performed under a chamber pressure of $4 \times 10^{-4}$ torr with a reactive-ion etching system (ME: Plasmaab). The reaction gas flow rates are: Ar, 25 sccm; and $CHF_3$, 25 sccm, and the operating power and etching time are 200 watts and 30 minutes, respectively. The silicon substrate 20 is placed into the chamber for isotropic etching, and the silicon dioxide 21 that is not protected by the chromium mask is etched in the vertical direction until the silicon dioxide is completely removed and exposes the silicon substrate 20 underneath. The remaining silicon dioxide 21 will be used as a mask for a subsequent wet anisotropic etching process using potassium hydroxide (KOH).

As shown in step (f) of FIG. 10, next, a potassium hydroxide etching solution with a volume percentage concentration of 15% is prepared. The ratio of isopropanol (IPA) and 45% potassium hydroxide solution to deionized water is 1:5:15. The addition of isopropanol (IPA) is due to its lower polarity and lower surface tension, which allows the hydrogen bubbles generated during the etching and attached to the structure to easily separate from the silicon surface, thereby preventing the silicon dioxide 21 masking from being etched off and increase the etching uniformity. After heating the etching solution to 75° C., the silicon substrate 20 is immersed in the etching solution for anisotropic etching about 10 to 20 minutes to produce the inverted pyramid array nanostructure (IPAN).

As shown in step (g) of FIG. 10, the silicon substrate 20 is immersed in a Buffered oxide etching (BOE) solution to remove the silicon dioxide 21 and chromium 25 on the top and bottom surface, thereby completing the three-dimensional inverted pyramid array nanostructure. Next, the organic substances, oxides, and metal particles remaining on the surface of the silicon substrate 20 are removed with Piranha solution and hydrofluoric acid solution (BOE). Next, the silicon substrate 20 is placed into an electron beam evaporation system (ULVAC), and the ohmic contact electrode 22 and the metal electrode 24 are deposited under a chamber pressure of $4 \times 10^{-6}$ torr. First, platinum with a thickness of 100 nm is deposited as an ohmic contact electrode 22 on the bottom surface of the silicon substrate 20. Then, a copper film with thickness 8 nm is deposited on the surface of IPAN structural of the silicon substrate 20 as a Schottky contact electrode, and finally a copper grid electrode with thickness of 120 nm is deposited on the copper Schottky contact electrode by using a shadow mask. The metal electrode 24 includes a copper Schottky contact electrode and a copper grid electrode. At this point, the photodetector 2 shown in FIG. 9 has been completed.

Figure 11:
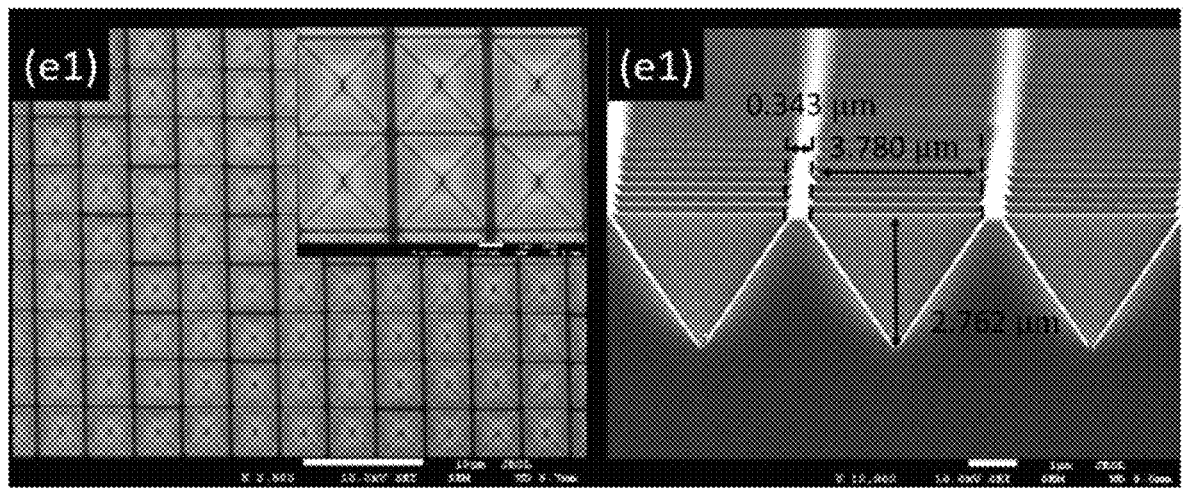
FIG. 11 is an SEM photograph of the top view and cross-sectional view showing the inverted pyramidal array nanostructure (IPAN) after etching for 20 minutes with KOH solution.
Figure 12:
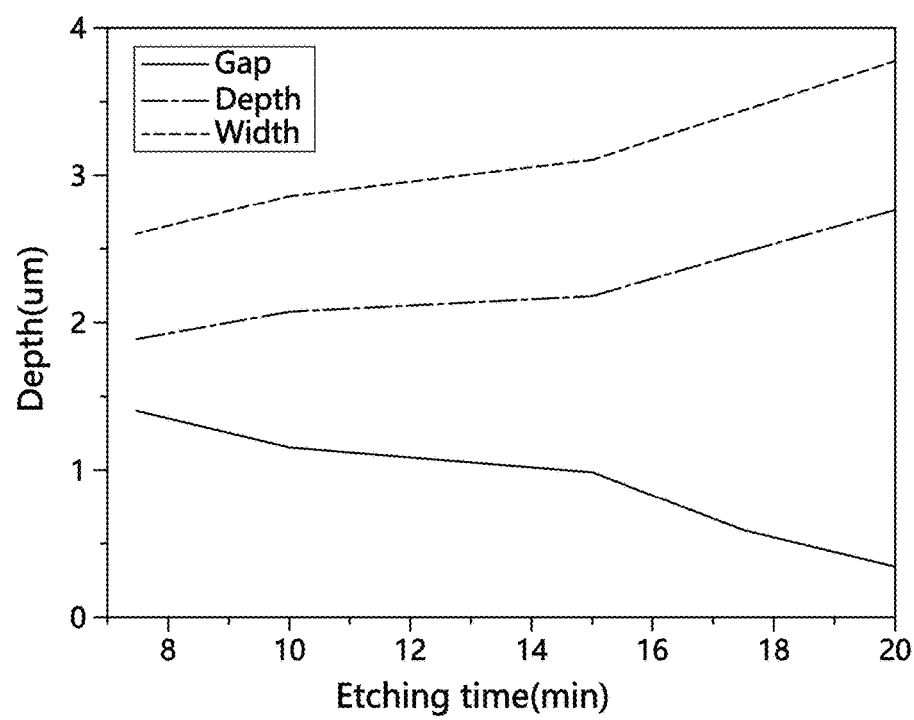
FIG. 12 shows the relationship between the line width and the etching time of inverted pyramidal array nanostructure (IPAN).

In the above manufacturing process, the topography of IPAN is highly related to the parameters of the lithography process and the KOH wet anisotropic etch. FIG. 11 are SEM pictures of the top view and the cross-sectional view showing the inverted pyramid array nanostructures after etching for 20 minutes with KOH solution. FIG. 12 shows the relationship between the structural parameters of the inverted pyramid array nanostructures and the etching time. As shown in FIG. 12, the maximum width of the top of each inverted pyramid element can reach 3.8 μm (width), and the gap between two adjacent inverted pyramid elements can reach 300 nm. In another embodiment, three-dimensional inverted pyramidal array nanostructures with period 6 μm and 8 μm are respectively fabricated by varying the period of exposure mask. The optimal KOH anisotropy etching time for the 6 μm and 8 μm period IPAN structures is 22 and 24 minutes, respectively.

Figure 23:
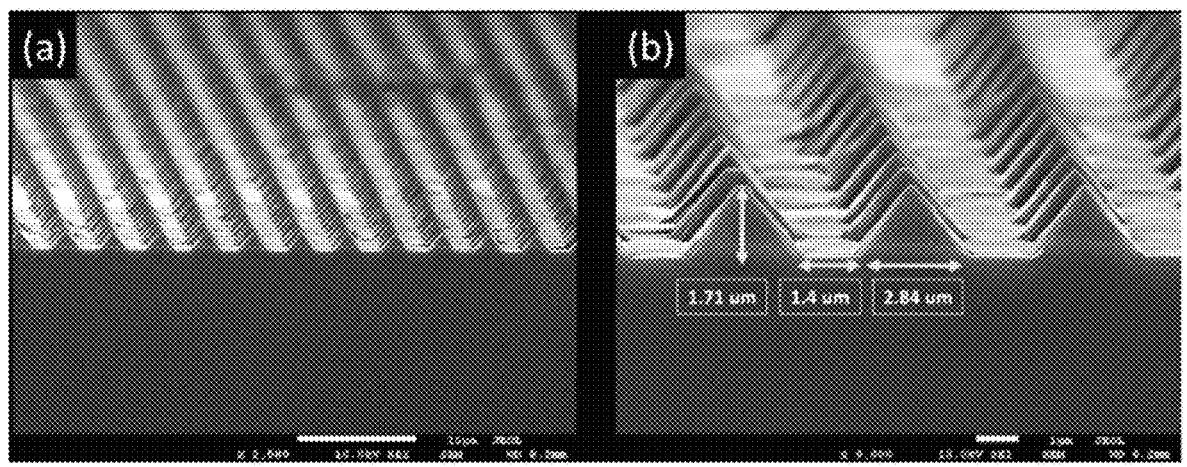
FIG. 23 is an SEM photograph showing a three-dimensional upright pyramidal array nanostructure fabricated in accordance with one embodiment of the present invention.

In another embodiment of the present invention, a three-dimensional upright pyramid array nanostructure (UPAN) is successfully fabricated by using the double exposure and KOH etching technology to reverse the exposed surface pattern with a negative photoresist. FIG. 23 is a SEM picture showing the fabricated three-dimensional upright pyramid array nanostructure.

Figure 13:
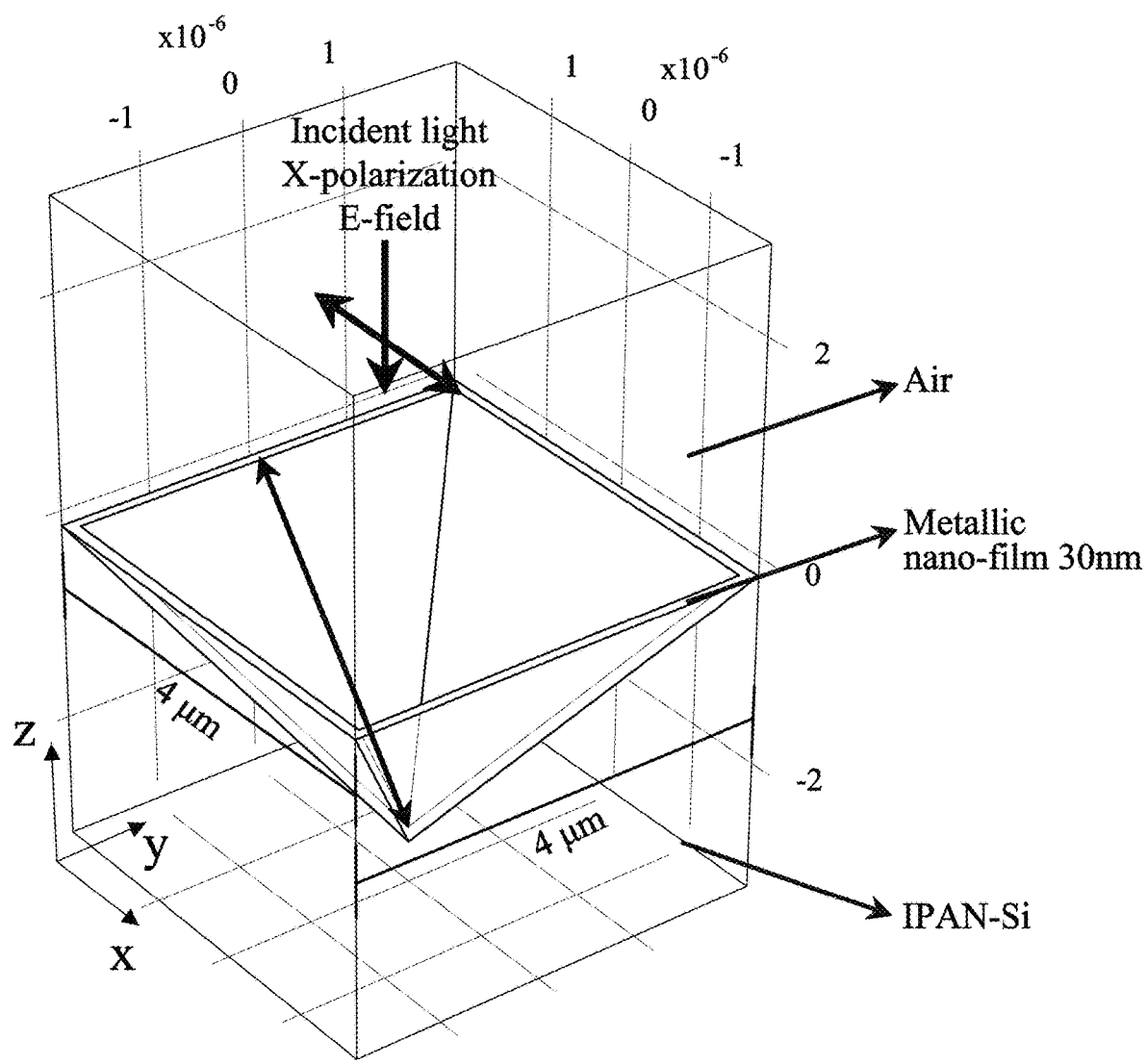
FIG. 13 shows inverted pyramidal array nanostructure (IPAN) simulated by using the finite element method.

In order to understand the localized surface plasmon resonance (LSPR) between the incident electromagnetic wave and the metal structure, the 3D finite-difference time-domain method (3D-FDTD) and the finite element method (FEM) are used to simulate the resonance of electromagnetic wave in an IPAN structure. FIG. 13 shows the IPAN structure used in the simulation, including: creating a space with volume $4 \times 4 \times 6$ μm³ (x,y,z); setting perfect matched layers (PML) for six boundary surfaces in this space; creating a silicon-based IPAN structure (IPAN-Si); setting a metallic nanofilm with a thickness of 30 nm on the surface of cavity of IPAN; setting the space above the metal nanofilm to air and setting the incident light from the top boundary of the space perpendicularly down in a $-\vec{Z}$ direction; setting the polarization direction of the incident light is X direction oscillation; and setting the wavelength of the incident electromagnetic wave is 500, 1000, 1500, 2000, 2500, 3000, 3500, and 4000 nm, respectively. The metal thickness is set to 30 nm instead of the 10 nm used in the experiment to avoid the problem of insufficient memory in the simulation. After the completion of the simulation calculation, the following formula (1) is used to normalize the intensity of the incident electromagnetic wave.

$$\text{Ratio} = \frac{|E|}{|E_0|} \quad (1)$$

In this embodiment, a copper nano-film with a thickness of 10 nm is deposited on the surface of the IPAN structure by an electron beam evaporation system to complete a metallic micro array nanostructure on the metal surface. Copper and P-type silicon form a Schottky junction at the metal-semiconductor junction with a Schottky barrier approximate 0.52 eV.

Figure 14:
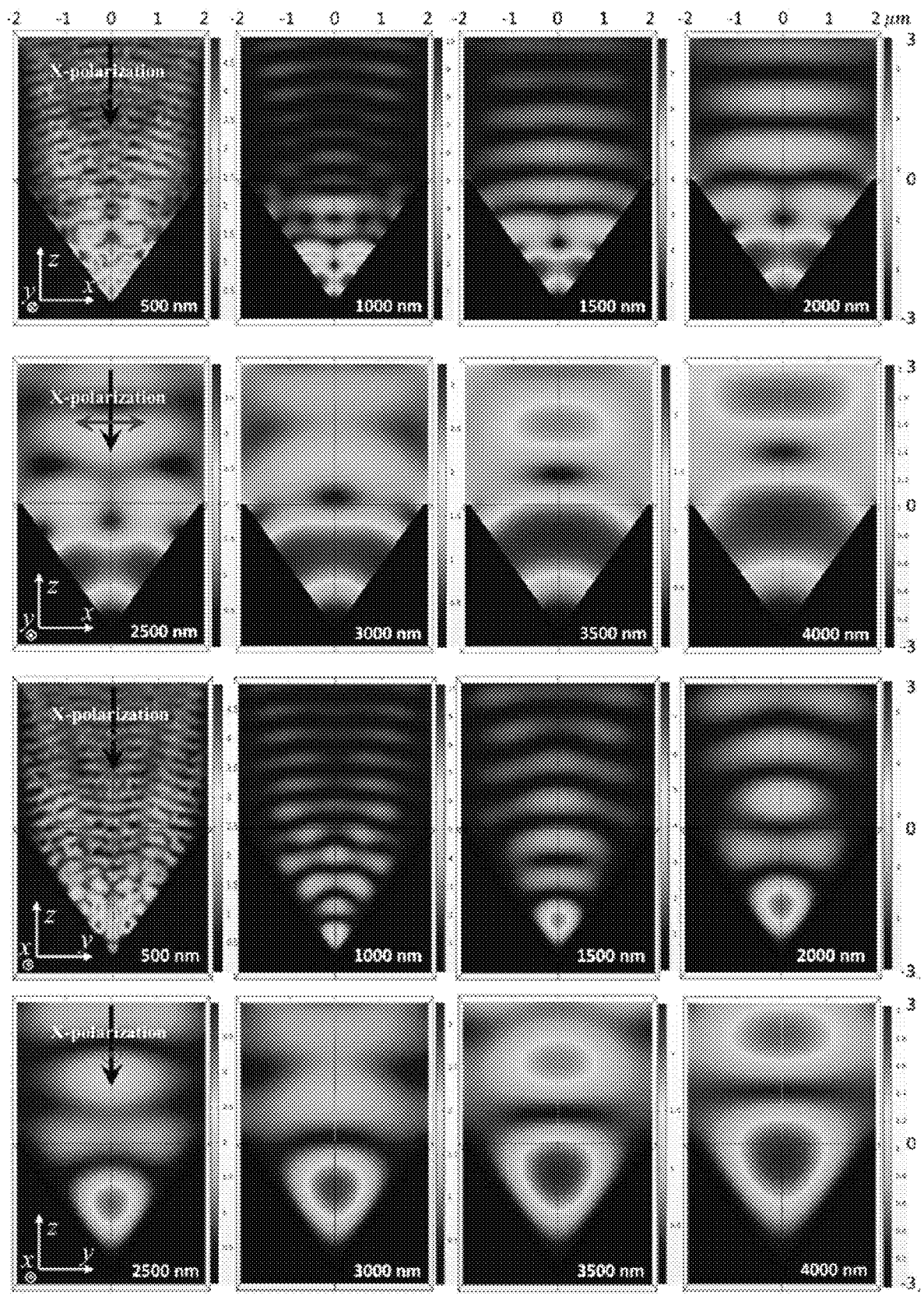
FIG. 14 shows simulation results of localized surface plasmon resonance of the IPAN where incident lights with different wavelengths are perpendicularly incident on the metal of the IPAN photodetector.

FIG. 14 shows simulation results of incident light 500, 1000, 1500, 2000, 2500, 3000, 3500, and 4000 nm perpendicularly incident on the metal of the IPAN photodetector, respectively. If the period of the structure is adjusted to 5-10 the resonance wavelength can also be increased to 5000-10000 nm as shown in FIG. 14. As shown in FIG. 14, strong light confinement effect can be observed within the cavity of Cu-IPAN structure for all incident wavelengths, indicates that this structure is a good three-dimensional resonance cavity. As the incident wavelength changes, the surface plasmonic resonance occurs in different regions with the cavity of the Cu-IPAN structure. When the incident wavelength is 500 nm, the length of resonance (LSPR) needs to be shorter because of the shorter wavelength of the incident light, so the matched nano-scaled length is located at the bottom of the Cu-IPAN structure to generate the LSPR. When the mid-infrared light with wavelength 1500-4000 nm is incident, the LSPR is generated by a matched microscaled length located near to the top of the Cu-IPAN structure due to the longer wavelength of the incident light. It can be clearly observed from all resonance simulations that the localized strong light field in the Cu-IPAN structure cavity is indeed continuous with the strong near-field of the metal and therefore produces a localized surface plasmon resonance (LSPR) on the metal surface. Therefore, it proves that because the IPAN structural has a geometric character with multiple cavity lengths, the incident light with wavelength up to 4 μm can find the corresponding resonance cavity length in the structure and generate localized surface plasmon resonance (LSPR), as shown in FIG. 14. In addition, because the IPAN structure satisfies the two-dimensional geometrical symmetry for unit and two-dimensional symmetry for periodical array, both X-polarized and the Y-polarized incident infrared light can generate an LSPR with excellent intensity on the structure surface. The IPAN structure is polarization-insensitive for incident light.

Figure 15:
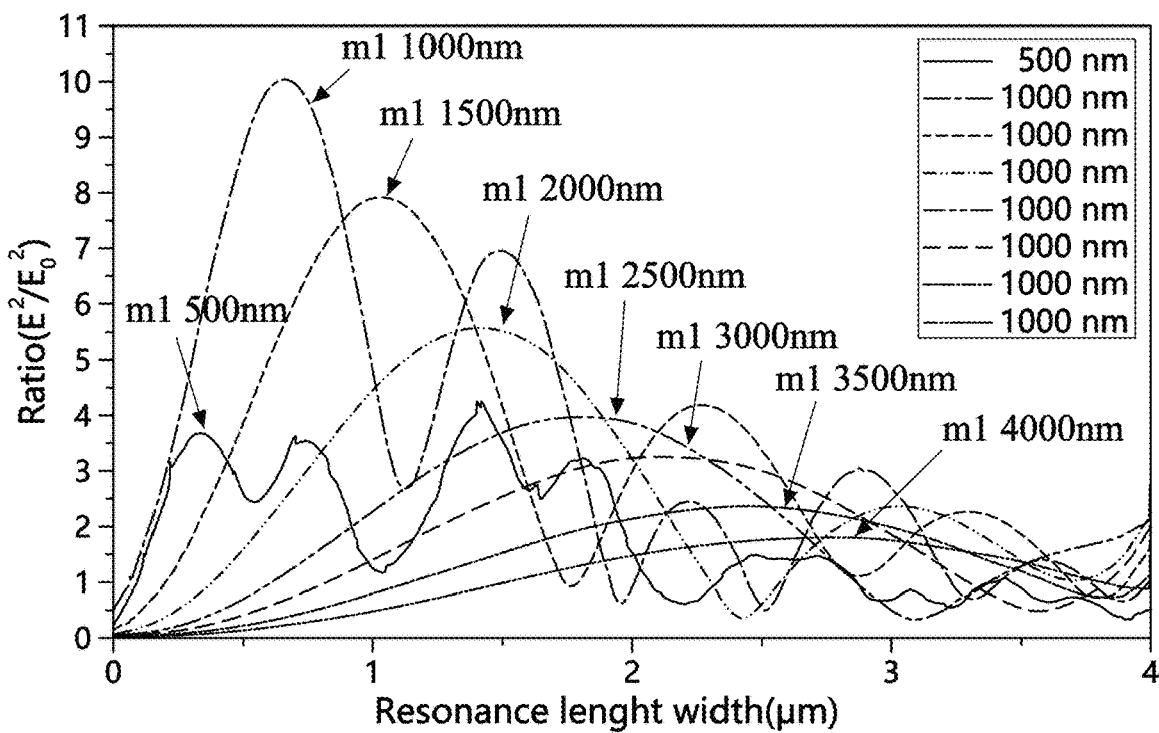
FIG. 15 shows the relationship between the localized surface plasmon resonance (LSPR) intensity and the length of the cavity wall of the IPAN of FIG. 13 for incident lights with different wavelengths.

FIG. 15 shows the relationship between the intensity of localized surface plasmon resonance and the cavity length for different wavelengths of incident light (data taken from black arrows in FIG. 13). For incident light with different wavelengths, the first resonant mode is the shortest resonant metal cavity length, as indicated by arrows in FIG. 15. As the wavelength of the incident light increases from 500 nm to 4000 nm, the resonant metal cavity length of the first resonance mode also increases. In addition, in the wavelength range of 1000-4000 nm, when the wavelength of the incident light increases, the resonance intensity of the first resonance mode becomes smaller. For example, the resonant intensity of the first resonant mode of the incident light with a wavelength of 1000 nm is stronger than that of the first resonant mode of the incident light with a wavelength of 4000 nm. To generate the localized surface plasmon resonance, the incident light with wavelength 1000 nm needs a cavity length of 700 nm, and the incident light intensity will be limited to the 700 nm cavity length for IPAN structure with a unit width of 4 μm. For incident light with wavelength 4000 nm needs a cavity length of 2700 nm, and the incident light intensity will be limited to the 2700 nm cavity length for IPAN structure with a unit width of 4 μm. Therefore, incident light with short wavelength will have a stronger intensity of localized surface plasmon resonance than incident light with long wavelength. To make longer wavelengths have better resonance intensity, it is only necessary to increase the period of the IPAN structure (i.e., the unit width of the IPAN structure), so that the long-wavelength incident light will have a stronger plasma confinement effect.

Figure 16:
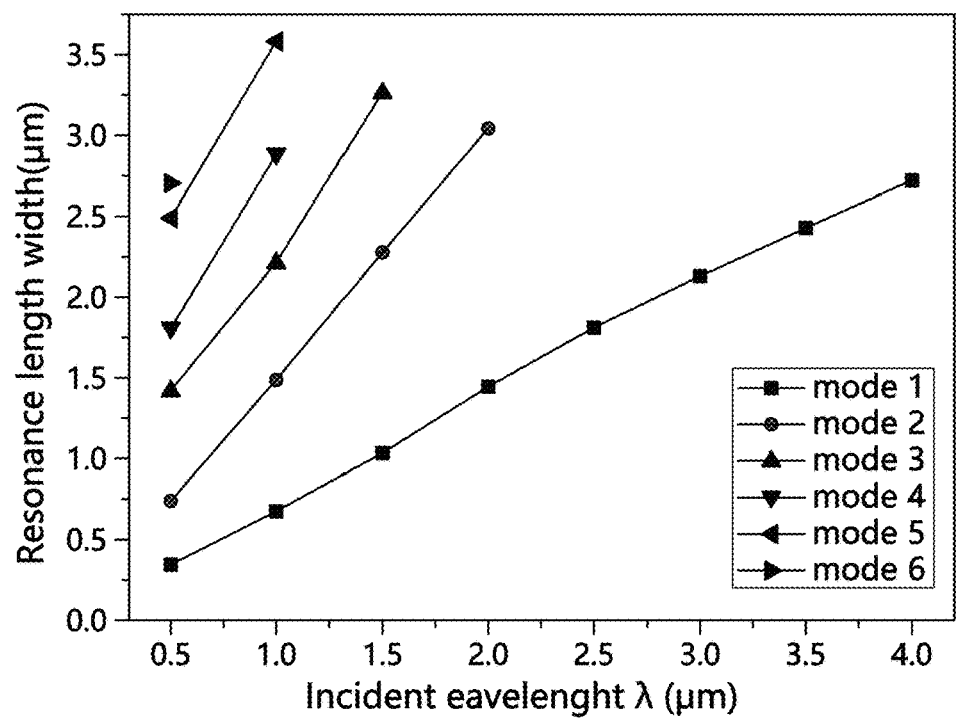
FIG. 16 shows the relationship between the wavelength of incident light and the length of cavity wall of the IPAN induced by the LSPR over various resonant modes.

FIG. 16 shows the relationship between the wavelength of incident light and the resonant cavity length inducing LSPR over various resonant modes. From FIG. 16, it can be seen that as the wavelength of the incident light increases, the resonant metal cavity length in the first resonant mode also increases. Here, the relationship between the wavelength and the matched resonant metal cavity length can be summarized as following equations (2)-(4). The resonant metal cavity length of the first resonant mode is approximately 0.7 times the wavelength of the incident light (equation 2), and the resonant metal cavity length of the second resonant mode is approximately 1.54 times the wavelength of the incident light (equation 3). The resonant metal cavity length is approximately 1.8 times the wavelength of incident light (equation 4), and the correlation coefficient $R^2$ of each equation is greater than 0.99.

$$L_{m1,cu} = 0.6925 \times \lambda + 0.014 \; (R^2=0.9974) \quad (2)$$

$$L_{m2,cu} = 1.5403 \times \lambda + 0.042 \; (R^2=0.9999) \quad (3)$$

$$L_{m3,cu} = 1.8532 \times \lambda + 0.447 \; (R^2=0.9941) \quad (4)$$

In another embodiment of the present invention, the LSPR simulation is performed with a gold/p-type IPAN structure and a silver/p-type IPAN structure. The results are very similar to those of the Cu-IPAN structure described above. It is thus confirmed that the key to generating localized surface plasmon resonance of the incident light by the IPAN structure lies in the multiple cavity lengths and the period of the structure. To induce high-intensity localized surface plasmon resonance with IPAN structure, the period of the IPAN structure must be designed to be about 4 times the target resonance wavelength (4 nm period IPAN corresponding to 1000 nm incident light), thereby reaching best light confinement effect and surface plasmon resonance intensity. A localized surface plasmon resonance structure with a single resonant metal length could be designed by referring to the above equations (2)-(4) and calculating the required resonant metal linear length and structure for the target wavelength, so that a high-intensity localized surface plasmon resonance structure can be obtained.

Figure 17:
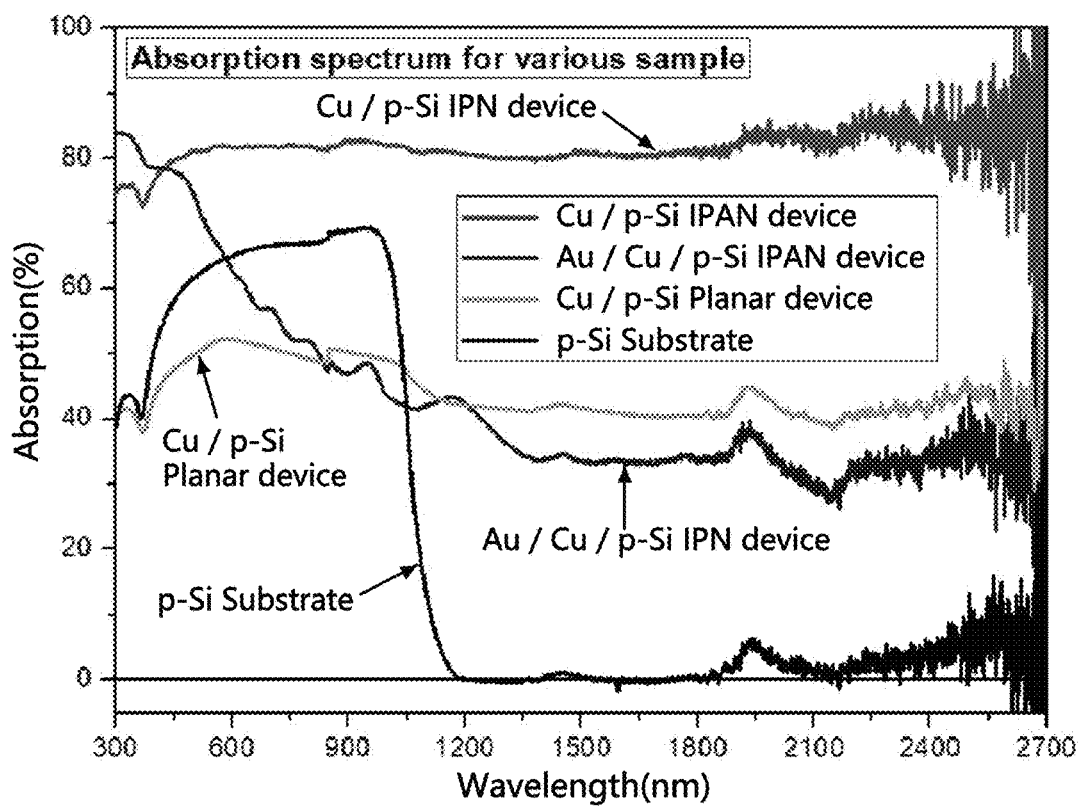
FIG. 17 shows absorption spectra of a comparative sample and the photodetector according to a second embodiment of the present invention.

FIG. 17 shows absorption spectrum of the double-side polished p-type silicon substrate, copper/p-type silicon planar Schottky photodetector, copper/p-type silicon IPAN Schottky photodetector, and gold/copper/p-type silicon planar Schottky photodetector. As shown in FIG. 17, the silicon substrate has a significant absorption of about 60-70% in the visible region before the cutoff wavelength of 1107 nm, and the absorption sharply decreases near the cutoff wavelength, and the absorption approaches zero after the cutoff wavelength. Due to the increased reflectivity of the copper film in the visible light range, the absorption of the copper/p-type planar photodetector in the visible light range is reduced by about 10% to 20% compared with the silicon substrate. However, in the infrared region, the Schottky junction energy barrier is formed due to the work function difference between silicon and copper, so that the incident photons do not directly penetrate through the silicon, and part of the incident light is absorbed by the Schottky junction, so that the absorption of planar photodetector of the infrared region ($\lambda$>1107 nm) below the energy gap of silicon can be increased to 40%, but this is slightly insufficient for the photodetector.

As shown in FIG. 17, compared with the above two, the IPAN structure has a 3D cavity effect for introducing an extremely broad-band LSPR, and the surface nanostructure can increase the active area, so that the absorption is significantly improved. The copper/p-type silicon IPAN photodetector has an absorption over 80% from the visible light region to the mid-infrared light region (450-2700 nm), achieving extremely broad frequency absorption characteristics. This absorption spectrum is in agreement with the simulation results showing extremely broad frequency resonance. The copper/p-type IPAN structure does have a gradually variable cavity length, and the incident light with wavelength less than 4000 nm can induce the LSPR and photon confinement effect to effectively enhance the light absorption. This copper/p-type IPAN structure has superior broadband resonant absorption compared to the 3D-DTTM structure recited in the journal Nature Communication (Lai, Y S, Chen, H. L., & Yu, C. C. (2014). Silicon-based broadband antenna for high responsivity and polarization-insensitive photodetection at telecommunication wavelengths. Nature communications, 5, 3288).

Figure 18:
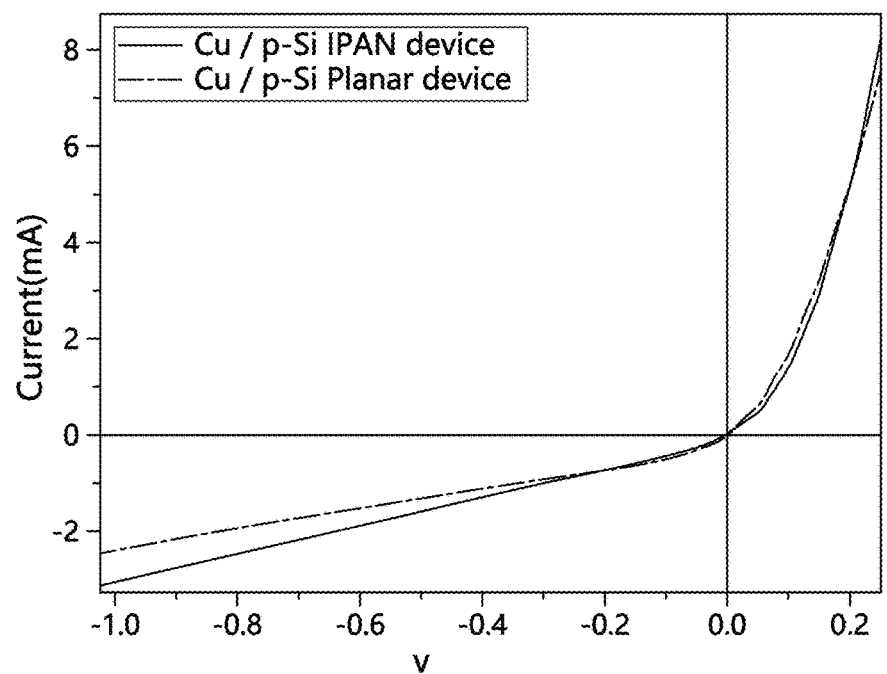
FIG. 18 shows dark current IV measurements of planar and IPAN copper/p-type Schottky photodetector according to the first and second embodiments of the present invention.

FIG. 18 shows dark current IV measurements of planar and IPAN copper/p-type Schottky photodetectors. As shown in FIG. 18, both the planar and the IPAN photodetectors exhibit the IV rectification characteristics of a standard Schottky diode, and both two photodetectors have a small turn on voltage compared to a PN junction diode when operated in a forward bias region. The turn on voltage of the two photodetectors is about 0.1 V, and the dark current of the two photodetectors in the reverse bias region is very small. In the operating region of the two photodetectors, the dark current is about 1.66 µA at 0 bias. Comparing the dark currents of the planar and the IPAN photodetector, it can be seen that the difference between the dark currents of the two photodetectors is not significant. It can be seen that the IPAN structure on the surface of the photodetector does not alter the dark current performance of the copper/p-type silicon Schottky photodetector.

Figure 19:
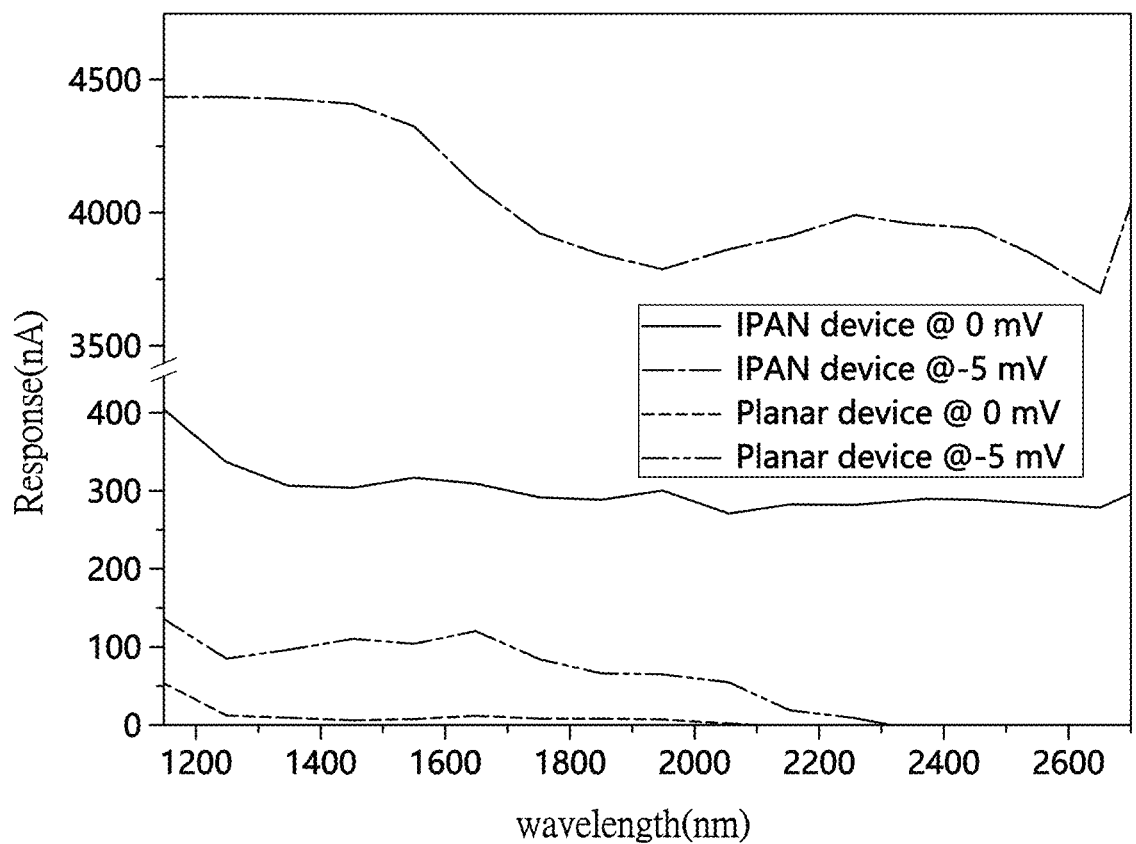
FIG. 19 shows the photo-electric responses measured with infrared lights at different wavelengths incident on the planar and IPAN photodetector, respectively.

In one embodiment, the planar and IPAN photodetectors are used for measuring infrared light with different wavelengths (1150-2700 nm). The photodetectors are operated at 0 bias and bias voltage of −5 mV to measure the dark current and light current, and calculate how much excess current or response occurs when various wavelengths of infrared light are incident on the photodetector. FIG. 19 shows responses of the planar and the IPAN photodetectors measured by infrared lights with different wavelengths. For the planar photodetector, when the photodetector is operated at 0 bias, the response of the photodetector decreases as the incident light wavelength becomes longer. This trend is also approximately consistent with the quantum transmission probability ($\eta_i$) formula $$\left(\eta_i = C\frac{(hv - \phi_B)^2}{hv}\right).$$

As the wavelength of the incident light increases, the incident photon energy decreases. Therefore, the response of the planar photodetector is more pronounced in the short-wavelength region than in the long-wavelength region, and when the photodetector is operated at −5 mV bias voltage, the response of the photodetector can be improved by 3 to 10 times. From this response, it can be observed that the cut-off voltage of the planar photodetector is about 2350 nm, which is equivalent to a Schottky barrier height about 0.53 eV. This is in comparison with the theoretically calculated Schottky barrier height of the copper/p type Si-based Schottky diode. The (Cu/P-type Si) junction has a Schottky barrier height of approximately 0.52 eV, demonstrating that the Cu/P-type Si-based Schottky photodetector of this invention is indeed measurable for measuring photons with photon energy less than the silicon band gap. However, the mechanism of the photocurrent generated by the planar photodetector is only the internal photoemission absorption (IPA), and it is not easy to achieve a high-efficiency response.

Figure 20:
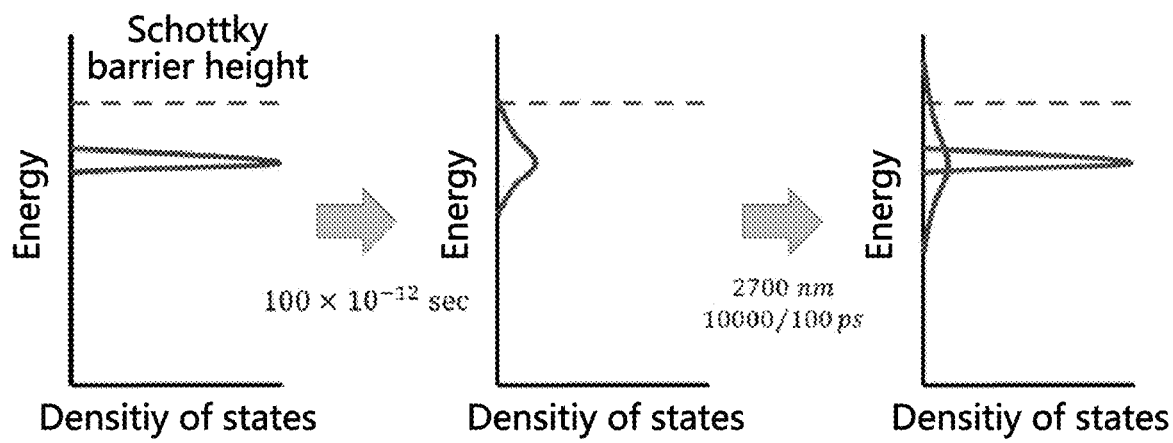
FIG. 20 shows the photodetector according to the second embodiment of the present invention, where after a part of the hot carriers collide with each other, they will obtain energy larger than the Schottky barrier and cross the energy barrier to form a thermal current.

FIG. 19 shows that the IPAN photodetector has an extremely broadband and high-intensity response, which is approximately 40 times higher than that of the planar photodetector. In addition, as the wavelength of incident light increases, the response will decrease, but it does not drop as fast as a planar photodetector and the cut-off wavelength of the IPAN photodetector is not observed in the measurement wavelength range. Because the surface of the IPAN photodetector possesses a surface plasmonic resonance structure and a three-dimensional optical resonant cavity, the incident photons can be effectively confined to the Schottky junction, and hence a strong near-field is provided and a lot of hot carriers are generated at the metal-semiconductor junction, so as to effectively improve the response of the photodetector. In addition, the IPAN structure has multiple cavity lengths, and the simulation results show that incident light with a wavelength 500-4000 nm can generate LSPR in the IPAN structure, and the resonance will increase as the incident light wavelength increases, as a result, not only the response is optimized in a specific wavelength range, but also a very broadband high-response can be achieved, so that the response will not drop rapidly as the incident wavelength increases. Furthermore, the measurement results also show that the IPAN photodetector can detect mid-infrared light with energy below the Schottky barrier (in this example, 0.53 eV: 2350 nm) because the IPAN photodetector has excellent LSPR resonance. The thermal carriers excited by infrared light from the incident are accumulated on the metal because their energy is lower than the Schottky barrier height and cannot cross the energy barrier. However, the LSPR resonance on the metal provides a large amount of excited hot carriers accumulated at the metal-semiconductor junction. After a lot of hot carriers collide with each other and reach thermal equilibrium, some hot carriers will gain energy larger than the Schottky barrier height and hence can cross the energy barrier to form the thermal current, as shown in FIG. 20. As a result, the IPAN photodetector not only can optimize the detection response of incident photons with energy below the Si bandgap, but also to detect mid-infrared light with energy below the Schottky barrier.

Figure 21:
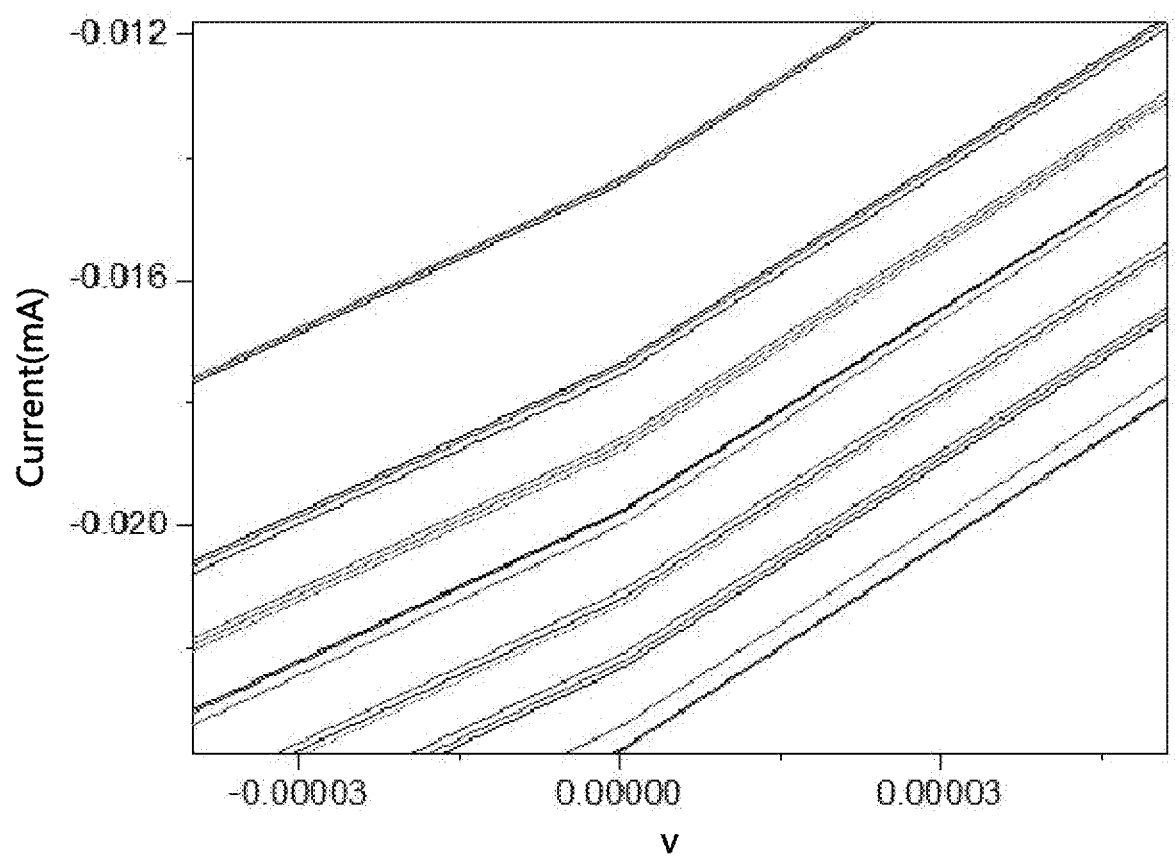
FIG. 21 shows the response of the photodetector in accordance with the second embodiment of the present invention operating with 1550 nm IR-Laser at different incident light intensities and bias voltages.

FIG. 21 shows the photocurrent response of the IPAN photodetector according to the embodiment of the present invention, where the IPAN photodetector is operated with 1550 nm IR-Laser having different incident light intensities (1.2-5.8 mW) and bias voltages, and the intensity of each incident light is measured for three times. The current responses of the photodetector for various incident light intensities are clearly different and gradually increase in response to the increase of incident light intensity. The seven IV curves in FIG. 21 are respectively measured by different incident light intensities as dark, 1.2 mW, 2 mW, 3 mW, 4 mW, 5 mW, and 5.8 mW, from top to bottom. The current response is proportional to the incident light intensity, and the measured original current data also shows a very high correlation with the incident light intensity.

Figure 22:
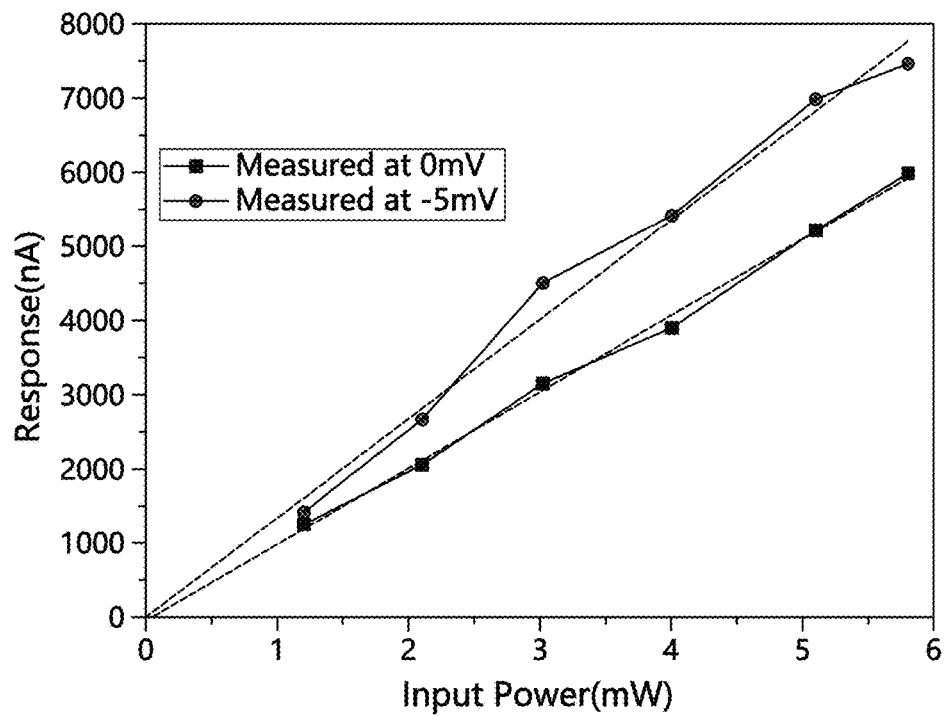
FIG. 22 is a chart showing the relationship between the response and the incident intensity of the photodetector according to the second embodiment of the present invention.

FIG. 22 shows the relationships between the response and the incident light intensity when the IPAN photodetector operates at 0 mV or −5 mV bias. When the IPAN photodetector is operated at 0 bias, the response of the photodetector is directly proportional to the intensity of incident infrared light, and the measurements show excellent linearity (high degree of linearity $R^2$=0.997) with a response about 1032 nA/mW. When the IPAN photodetector is operated at −5 mV bias, the response of the photodetector is also directly proportional to the intensity of incident infrared light, and the measurements show good linearity (high degree of linearity $R^2$=0.9864) with a response about 1343 nA/mW, which has about 30% promotion compared with operating at 0 bias. The photodetectors of this invention provide stronger response and wider broadband absorption detection than current devices disclosed in the literatures, such as the three-dimensional antenna deep trench/thin metal structure made by Knight et al. (Knight, M W, Sobhani, H., Nordlander, P., & Halas, N J (2011). Photodetection with active optical antennas. Science, 332(6030), 702-704.) and Lin, Keng-Te, et al, (Lai, Y S, Chen, H L, & Yu, C C (2014) Silicon-based broadband antenna for high responsivity and polarization-insensitive photodetection at telecommunication wavelengths. Nature Communications, 5, 3288).

Figure 24:
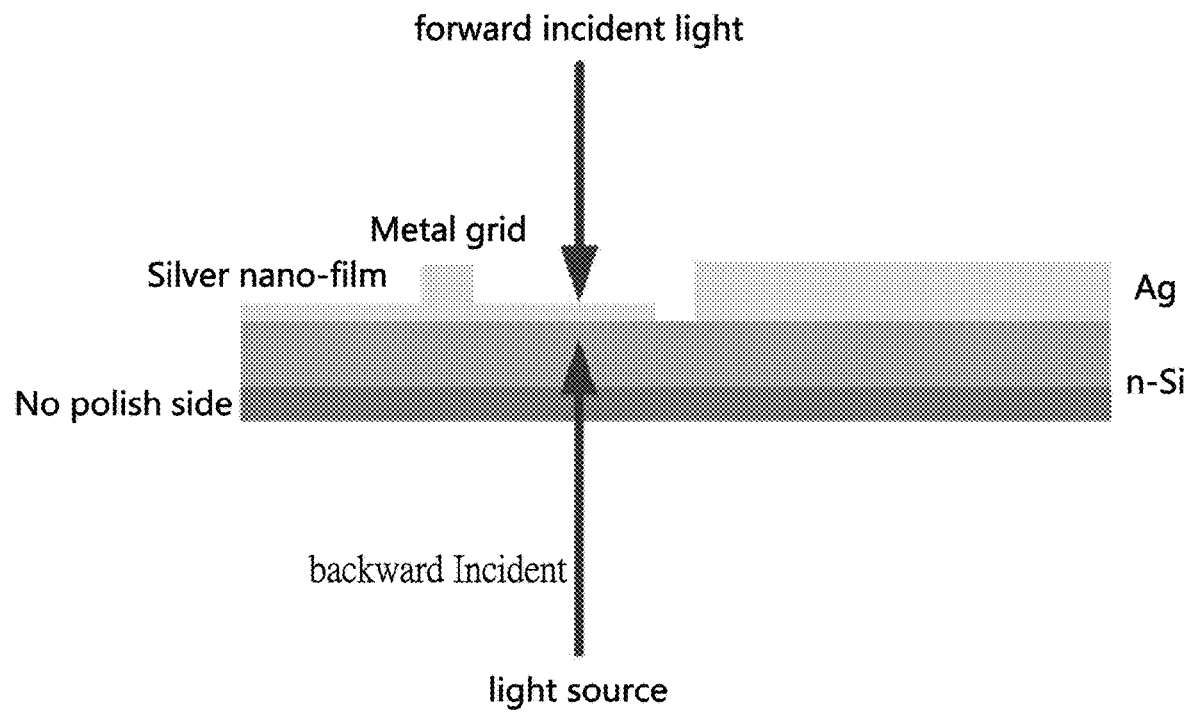
FIG. 24 shows a Schottky contact made by plating a nano silver film on a planar silicon substrate according to one embodiment of the present invention.
Figure 25:
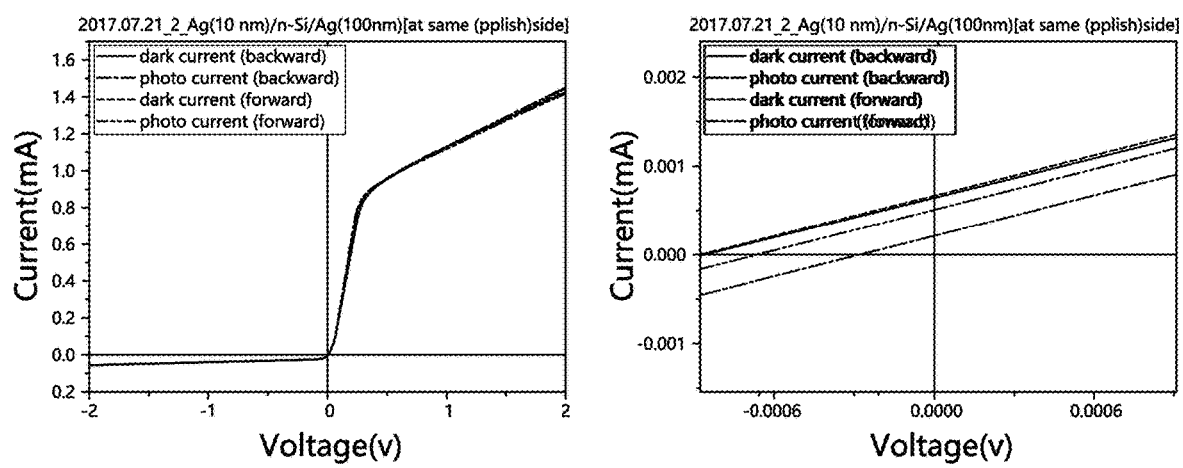
FIG. 25 is a response of FIG. 24, in which lights are incident on the Schottky contact in different directions.

FIG. 24 shows a Schottky contact made by depositing a silver nano-film on a planar silicon substrate according to an embodiment of the present invention. FIG. 25 is a diagram showing the current response of FIG. 24 in which the device is operated at a wide-range of voltages and 0 bias and lights are forward or backward incident to the Schottky contact of the device. As shown in FIG. 25, the current response of the device is very stable when operating at 0 mV, and it is found that the response of the device with backward incident light is about twice as large as that with forward incident light. When the light is forward incident to the Schottky junction, the light must pass through the metal thin film and will be absorbed by the metal. Conversely, when the light is backward incident to the Schottky junction, the light can directly hit the Schottky junction. This backward incident manner can only be applied to the infrared band detection, because the silicon substrate has a great absorption in the visible light region.

As shown in FIGS. 24 and 25, when the light is changed to backward incident to the Schottky junction, the original silver Schottky contact nano-film could be thicker and changed from 10 nm to 100 nm. With the thicker Schottky contact, the disadvantage of easy oxidation of the thin film layer can be improved.

Figure 26:
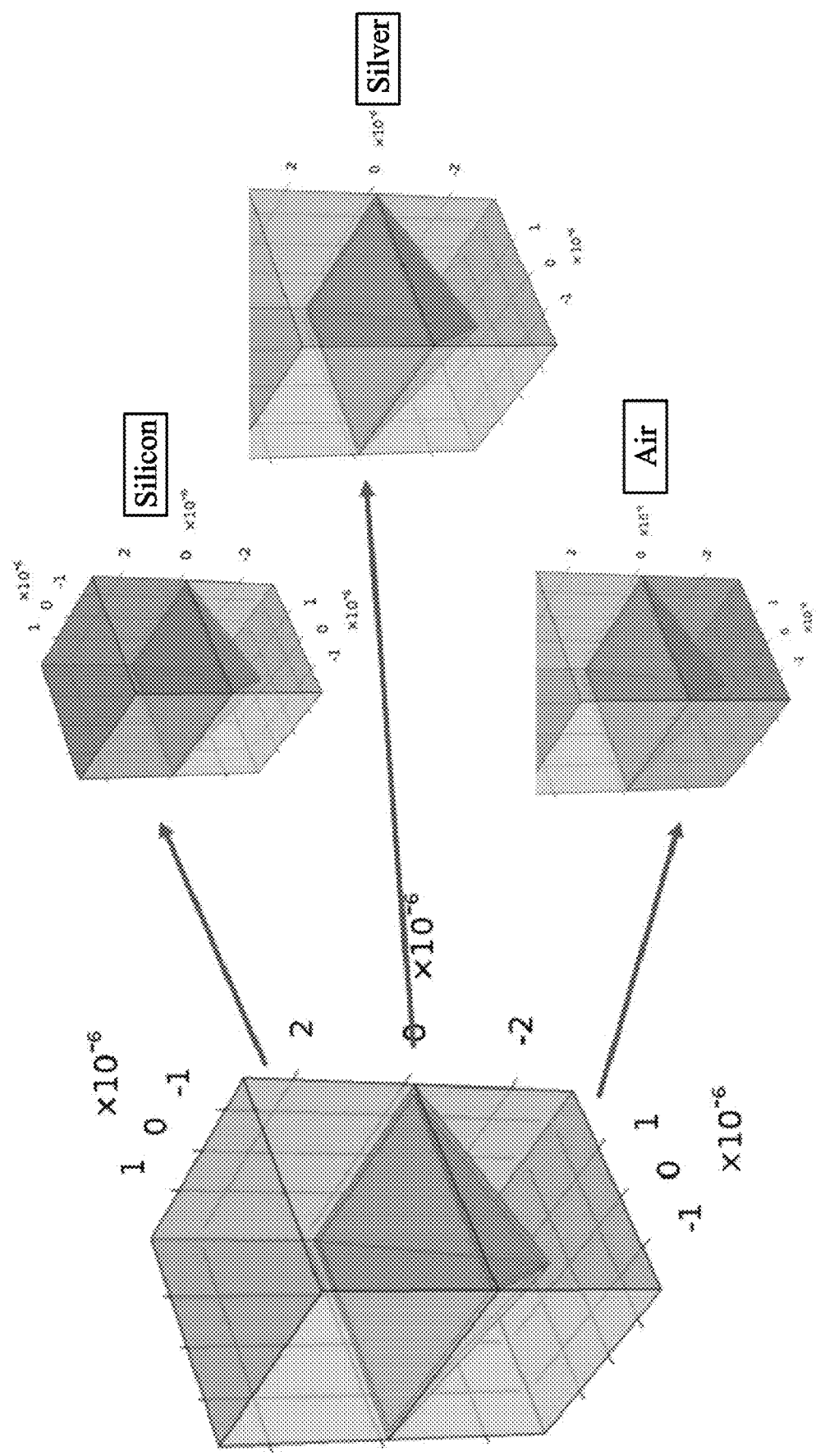
FIG. 26 shows an inverted pyramidal array nanostructure (IPAN) simulated using the finite element method in which light is changed to be incident on the Schottky contact from the silicon substrate.
Figure 27:
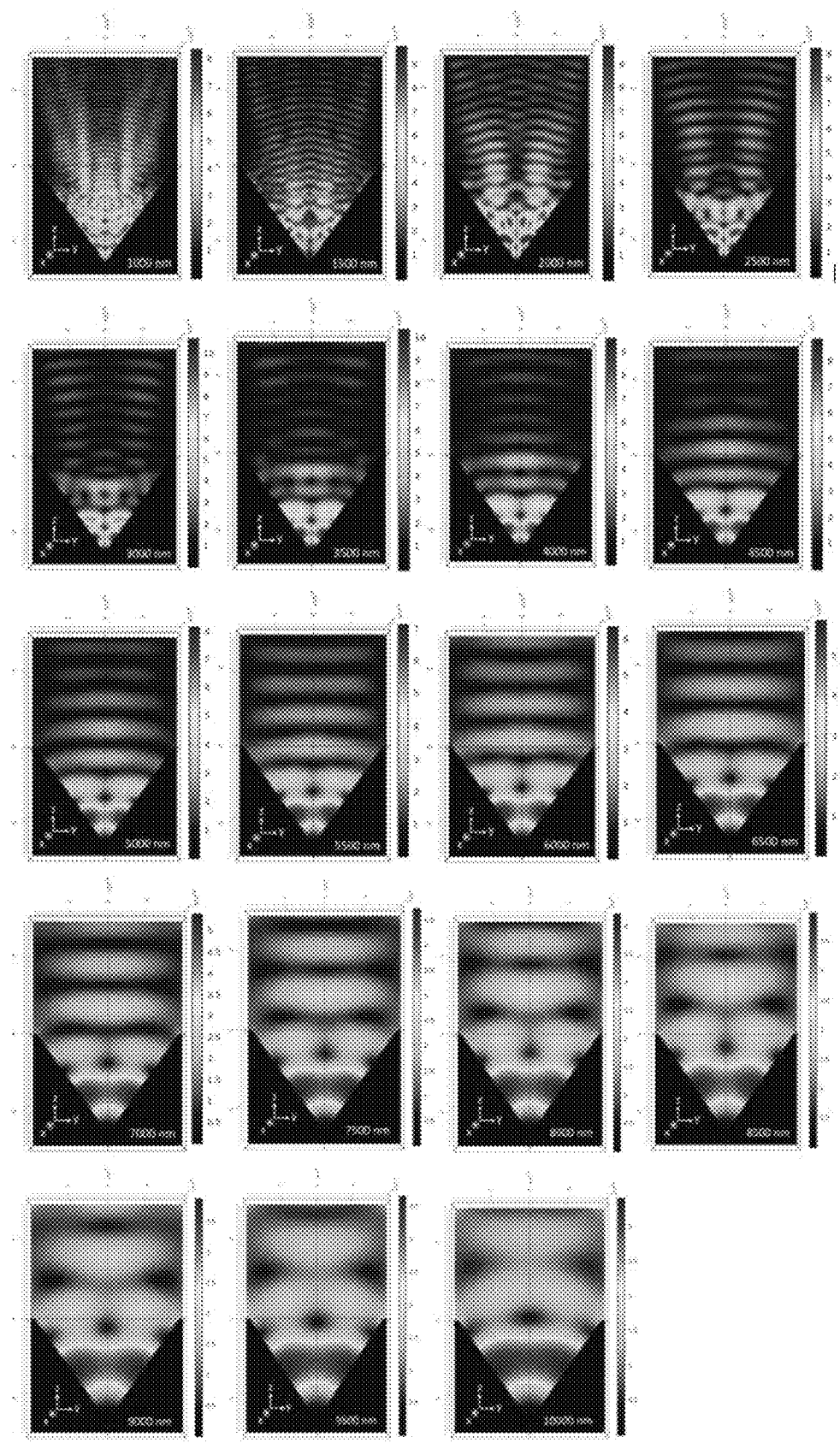
FIG. 27 shows simulation results of localized surface plasmon resonance in which incident light with different wavelengths are perpendicularly incident on the metal of the upright pyramid array nanostructure (UPAN).

FIG. 26 shows an upright pyramidal array nanostructure (UPAN) structure simulated by the finite element method and the light is changed to be incident on the Schottky contact from the silicon substrate. FIG. 27 shows the simulation results in which lights with wavelengths 1000, 1500, 2000, 2500, 3000, 3500, 4000, 4500, 5000, 5500, 6000, 6500, 7000, 7500, 8000, 8500, 9000, 9500, 1000 nm are perpendicular incident to the metal electrode of UPAN, respectively. Cavities are formed between the upright pyramids. A strong light field confinement effect can be observed in the cavities of the Ag-UPAN structure for all incident wavelengths, indicating that this structure is also a good three-dimensional resonant cavity. As the incident wavelength changes, the surface plasmonic resonance occurs in different regions of the cavity of the Ag-UPAN structure. In this structure, the equivalent wavelength of the incident light will decrease because the light entering the silicon substrate will lead to the increase of the refractive index, and the matched linear length can be found in the cavity for the equivalent wavelength. In addition, it can be clearly observed from all resonance simulations that the local strong light field in the cavity of Ag-UPAN structure is indeed continuous with the strong near-field on the metal and produces a pronounced localized surface plasmon resonance (LSPR) on the metal surface. This proves that the UPAN structural also has variable or multiple cavity lengths to introduce broadband LSPR.

In an embodiment of the present invention, a Si-based Schottky photodetector is successfully fabricated on a p-type silicon substrate using a metal-semiconductor junction (Cu—Si). And an IPAN (or UPAN) structure is used to optimize the response of the photodetector. The IPAN structure has the characteristics of one-dimensional variant linear length, two-dimensional symmetrical periodic array, and three-dimensional optical resonant cavity, and can effectively improve the light confinement effect and generate photocurrent. From the results of 3D-FDTD and FEM simulations, it can be seen that in the 500-4000 nm incident wavelength range, the matched linear length can be found in the copper/p-type IPAN structure to induce LSPRs, enabling a very broadband LSPR being achieved by the copper/p-type IPAN structure. In addition, the relationship between the wavelength of the incident electromagnetic wave and the linear length of IPAN has been successfully summarized. From the absorption spectrum, it can also be observed that the absorption of the copper/p-type Si-based IPAN photodetector has an extremely broadband absorption of more than 80% within the wavelength of 450-2700 nm. It has indeed succeeded in breaking through the conventional LSPR structure that can only induce surface plasmon resonance at a narrow frequency. From the response measurements for incident light with different wavelengths, it can be observed that the copper/p-type IPAN structure has an excellent response in the incident wavelength range of 1150-2700 nm. When the device is operated at 0 bias and 5 mV, the average response is higher than 300 nA and 3500 nA, respectively, and the response does not decrease drastically as the incident light wavelength increases. When the photodetector device is operated with 1550 nm IR-Laser at 0 bias, the response of the device is even up to 1032 nA/mW. In addition, due to the excellent surface plasmon resonance effect of copper/p-type IPAN structure, the IPAN structure can not only optimize the detection response of incident photons with energy below the energy gap of silicon, but also detect incident mid-infrared light photons (2700 nm) with energy lower than the Schottky barrier. In addition, the copper/p-type IPAN structure has advantages of extremely broadband absorption, polarization insensitive resonance, and strong response. In addition, the copper/p-type silicon IPAN photodetector is fabricated by a silicon semiconductor process and a solution etching process. These processes are mature and stable and employ not expensive equipment and materials. Accordingly, the fabricated photodetectors have excellent potential to be integrated into a silicon-based integrated circuit to develop related silicon-based chips for visible-infrared detectors or infrared thermal imagers.

The intent accompanying this disclosure is to have each/all embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention. Corresponding or related structure and methods disclosed or referenced herein, and/or in any and all co-pending, abandoned or patented application(s) by any of the named inventor(s) or assignee(s) of this application and invention, are incorporated herein by reference in their entireties, wherein such incorporation includes corresponding or related structure (and modifications thereof) which may be, in whole or in part, (i) operable and/or constructed with, (ii) modified by one skilled in the art to be operable and/or constructed with, and/or (iii) implemented/made/used with or in combination with, any part(s) of the present invention according to this disclosure, that of the application and references cited therein, and the knowledge and judgment of one skilled in the art.

Conditional language, such as, among others, "can," "could," "might," or "may," unless specifically stated otherwise, or otherwise understood within the context as used, is generally intended to convey that embodiments include, and in other interpretations do not include, certain features, elements and/or steps. Thus, such conditional language is not generally intended to imply that features, elements and/or steps are in any way required for one or more embodiments, or interpretations thereof, or that one or more embodiments necessarily include logic for deciding, with or without user input or prompting, whether these features, elements and/or steps are included or are to be performed in any particular embodiment.

All of the contents of the preceding documents are incorporated herein by reference in their entireties. Although the disclosure herein refers to certain illustrated embodiments, it is to be understood that these embodiments have been presented by way of example rather than limitation. For example, any of the particulars or features set out or referenced herein, or other features, including method steps and techniques, may be used with any other structure(s) and process described or referenced herein, in whole or in part, in any combination or permutation as a non-equivalent, separate, non-interchangeable aspect of this invention. Corresponding or related structure and methods specifically contemplated and disclosed herein as part of this invention, to the extent not mutually inconsistent as will be apparent from the context, this specification, and the knowledge of one skilled in the art, including, modifications thereto, which may be, in whole or in part, (i) operable and/or constructed with, (ii) modified by one skilled in the art to be operable and/or constructed with, and/or (iii) implemented/made/used with or in combination with, any parts of the present invention according to this disclosure, include: (I) any one or more parts of the above disclosed or referenced structure and methods and/or (II) subject matter of any one or more of the inventive concepts set forth herein and parts thereof, in any permutation and/or combination, include the subject matter of any one or more of the mentioned features and aspects, in any permutation and/or combination.

Although specific embodiments have been illustrated and described, it will be appreciated by those skilled in the art that various modifications may be made without departing from the scope of the present invention, which is intended to be limited solely by the appended claims.

What is claimed is:

1. A photodetector, comprising:
   a semiconductor having a region that is etched to form a micro-nanostructure;
   an ohmic contact electrode forming an ohmic contact with a surface of the semiconductor;
   a metal electrode having a metal film and an electrode, the metal film covering a surface of the micro-nanostructure and forming a Schottky contact with the surface of the micro-nanostructure, the electrode connecting the metal film;
   wherein carriers in the metal electrode are excited by an incident light to form electron hole pairs or hot carriers to cross a Schottky barrier between a junction of the metal electrode and the semiconductor and thus form a photocurrent.

2. The photodetector as recited in claim 1, wherein the metal electrode comprises chromium, copper, or a material capable of forming the Schottky contact with the surface of the micro-nanostructure, and the ohmic contact electrode comprises gold, silver, platinum, or a material that can form an ohmic contact with the surface of the semi conductor.

3. The photodetector as recited in claim 1, wherein photons with energy smaller than the Schottky barrier and the band gap of semiconductor both can be detected.

4. The photodetector as recited in claim 1, wherein the incident light enters from the surface of the semiconductor.

5. The photodetector as recited in claim 1, wherein the semiconductor comprises silicon.

6. The photodetector as recited in claim 1, wherein the micro-nanostructure comprises a nanostructure array.

7. The photodetector as recited in claim 6, wherein each nanostructure of the nanostructure array comprises multiple linear lengths, and the incident light with a wavelength corresponds one of the linear lengths to induce a localized surface plasmon resonance (LSPR).

8. The photodetector as recited in claim 1, wherein the micro-nanostructure is an upright pyramidal array nanostructure.

9. The photodetector as recited in claim 8, wherein each of the upright pyramidal array nanostructure has a cavity with multiple cavity lengths.

10. The photodetector as recited in claim 8, wherein the incident light with a wavelength range of 1000 nm to 10000 nm can induce a localized surface plasmon resonance in the upright pyramidal array nanostructure.

11. The photodetector as recited in claim 10, wherein the localized surface plasmon resonance is polarization-insensitive.

12. The photodetector as recited in claim 1, wherein the micro-nanostructure is an inverted pyramidal array nanostructure.

13. The photodetector as recited in claim 12, wherein the absorption spectrum of the photodetector has an absorption ratio more than 80% in the wavelength range between 450 nm and 2700 nm.

14. The photodetector as recited in claim 12, wherein photodetector operates at a bias of 0 mV with the incident light of 1550 nm and has an average response higher than 1032 nA.

15. The photodetector as recited in claim 12, wherein the photodetector operates at a bias voltage of 5 mV and has an average photocurrent response higher than 3500 nA.

16. The photodetector as recited in claim 12, wherein the photodetector operates at a bias voltage of 0 mV and has an average photocurrent response higher than 300 nA.

17. The photodetector as recited in claim 12, wherein the period of inverted pyramidal array nanostructure is four times the wavelength of the incident light.

18. The photodetector as recited in claim 12, wherein each of the inverted pyramidal array nanostructure has a cavity with multiple cavity lengths.

19. The photodetector as recited in claim 12, wherein the incident light with a wavelength range of 500 nm to 4000 nm can induce a localized surface plasmon resonance in the inverted pyramidal array nanostructure.

20. The photodetector as recited in claim 19, wherein the localized surface plasmon resonance is polarization-insensitive.

* * * * *